United States Patent
Dokania et al.

(10) Patent No.: US 12,166,011 B1
(45) Date of Patent: *Dec. 10, 2024

(54) METHOD OF FORMING AN ARTIFICIAL INTELLIGENCE PROCESSOR WITH THREE-DIMENSIONAL STACKED MEMORY

(71) Applicant: Kepler Computing Inc., San Francisco, CA (US)

(72) Inventors: Rajeev Kumar Dokania, Beaverton, OR (US); Sasikanth Manipatruni, Portland, OR (US); Amrita Mathuriya, Portland, OR (US); Debo Olaosebikan, San Francisco, CA (US)

(73) Assignee: Kepler Computing Inc., San Francisco, CA (US)

( * ) Notice: Subject to any disclaimer, the term of this patent is extended or adjusted under 35 U.S.C. 154(b) by 414 days.

This patent is subject to a terminal disclaimer.

(21) Appl. No.: 17/230,890

(22) Filed: Apr. 14, 2021

Related U.S. Application Data

(63) Continuation of application No. 16/428,885, filed on May 31, 2019, now Pat. No. 11,043,472.

(51) Int. Cl.
   *G11C 11/401* (2006.01)
   *H01L 23/498* (2006.01)
   (Continued)

(52) U.S. Cl.
   CPC ........ *H01L 25/0657* (2013.01); *G11C 11/401* (2013.01); *H01L 23/49811* (2013.01);
   (Continued)

(58) Field of Classification Search
   CPC ........... H01L 25/0657; H01L 23/49811; H01L 23/49894; H01L 23/5389; G11C 11/401;
   (Continued)

(56) References Cited

U.S. PATENT DOCUMENTS 5,834,162 A   11/1998   Malba
6,256,248 B1   7/2001   Leung
(Continued)

FOREIGN PATENT DOCUMENTS

CN   104081516 B   2/2017
GB   2323188 A   9/1998
(Continued)

OTHER PUBLICATIONS

1st Office Action & Search Report notified Dec. 9, 2020, for Taiwan Patent Application No. 109106755.
(Continued)

*Primary Examiner* — Mushfique Siddique
(74) *Attorney, Agent, or Firm* — MUGHAL GAUDRY & FRANKLIN PC

(57) ABSTRACT

Described is a packaging technology to improve performance of an AI processing system. An IC package is provided which comprises: a substrate; a first die on the substrate, and a second die stacked over the first die. The first die includes memory and the second die includes computational logic. The first die comprises DRAM having bit-cells. The memory of the first die may store input data and weight factors. The computational logic of the second die is coupled to the memory of the first die. In one example, the second die is an inference die that applies fixed weights for a trained model to an input data to generate an output. In one example, the second die is a training die that enables learning of the weights. Ultra high-bandwidth is changed by placing the first die below the second die. The two dies are wafer-to-wafer bonded or coupled via micro-bumps.

19 Claims, 26 Drawing Sheets

(51) Int. Cl.
*H01L 23/538* (2006.01)
*H01L 25/065* (2023.01)
*H10B 41/42* (2023.01)
*G11C 5/06* (2006.01)
*G11C 11/54* (2006.01)

(52) U.S. Cl.
CPC .... *H01L 23/49894* (2013.01); *H01L 23/5389* (2013.01); *H10B 41/42* (2023.02); *G11C 5/06* (2013.01); *G11C 5/063* (2013.01); *G11C 11/54* (2013.01)

(58) Field of Classification Search
CPC ........... G11C 5/06; G11C 5/063; G11C 11/54; H10B 41/42
See application file for complete search history.

(56) References Cited

U.S. PATENT DOCUMENTS

| | | | |
|---|---|---|---|
| 6,487,135 B2 | 11/2002 | Watanabe et al. | |
| 6,890,798 B2 | 5/2005 | McMahon | |
| 7,146,454 B1 | 12/2006 | Li et al. | |
| 7,217,596 B2 | 5/2007 | Cobbley et al. | |
| 7,683,459 B2 | 3/2010 | Ma et al. | |
| 7,992,017 B2 | 8/2011 | Safford et al. | |
| 8,143,710 B2 | 3/2012 | Cho | |
| 8,198,716 B2 | 6/2012 | Periaman et al. | |
| 8,245,065 B2 | 8/2012 | Niggemeier et al. | |
| 8,525,342 B2 | 9/2013 | Chandrasekaran et al. | |
| 8,546,955 B1* | 10/2013 | Wu | H01L 23/5384 257/723 |
| 8,547,769 B2 | 10/2013 | Saraswat et al. | |
| 8,612,809 B2 | 12/2013 | Casper et al. | |
| 8,701,073 B1 | 4/2014 | Fu et al. | |
| 8,759,899 B1 | 6/2014 | Lue et al. | |
| 8,896,126 B2 | 11/2014 | Setardja | |
| 8,947,931 B1 | 2/2015 | d'Abreu | |
| 9,165,968 B2 | 10/2015 | Chao et al. | |
| 9,379,078 B2 | 6/2016 | Yu et al. | |
| 9,627,365 B1 | 4/2017 | Yu et al. | |
| 9,748,190 B2 | 8/2017 | Chen et al. | |
| 10,074,423 B1 | 9/2018 | Hermesh et al. | |
| 10,461,076 B1 | 10/2019 | Brewer | |
| 10,741,525 B2 | 8/2020 | Takishita et al. | |
| 11,009,938 B1 | 5/2021 | Law et al. | |
| 11,043,472 B1* | 6/2021 | Dokania | H01L 23/5389 |
| 11,139,270 B2 | 10/2021 | Manipatruni et al. | |
| 11,152,343 B1* | 10/2021 | Dokania | H01L 23/544 |
| 11,171,115 B2 | 11/2021 | Manipatruni et al. | |
| 11,238,206 B1 | 2/2022 | Sivaswamy et al. | |
| 11,309,895 B2 | 4/2022 | Dabral et al. | |
| 11,436,402 B1 | 9/2022 | Liu et al. | |
| 11,488,935 B1 | 11/2022 | Zaman et al. | |
| 11,694,940 B1 | 7/2023 | Mathuriya et al. | |
| 2003/0097543 A1 | 5/2003 | Wishneusky | |
| 2006/0179329 A1 | 8/2006 | Terechko et al. | |
| 2007/0208902 A1 | 9/2007 | Park et al. | |
| 2007/0234094 A1 | 10/2007 | Samra et al. | |
| 2008/0126611 A1 | 5/2008 | Tu et al. | |
| 2009/0019411 A1 | 1/2009 | Chandra et al. | |
| 2009/0103854 A1 | 4/2009 | Beausoleil et al. | |
| 2010/0008058 A1 | 1/2010 | Saen et al. | |
| 2010/0057404 A1 | 3/2010 | Dittmann et al. | |
| 2010/0077179 A1 | 3/2010 | Stillwell, Jr. et al. | |
| 2010/0167467 A1 | 7/2010 | Aoi | |
| 2010/0228955 A1 | 9/2010 | Niggemeier et al. | |
| 2010/0321993 A1 | 12/2010 | Nikonov et al. | |
| 2011/0222540 A1 | 9/2011 | Mital et al. | |
| 2012/0098140 A1 | 4/2012 | Bartley et al. | |
| 2012/0106117 A1 | 5/2012 | Sundaram et al. | |
| 2012/0146207 A1 | 6/2012 | Chou et al. | |
| 2012/0239904 A1 | 9/2012 | Ekanadham et al. | |
| 2013/0086395 A1 | 4/2013 | Liu | |
| 2013/0141858 A1 | 6/2013 | Pyeon | |
| 2013/0175686 A1 | 7/2013 | Meyer et al. | |
| 2013/0205143 A1 | 8/2013 | Eastlack | |
| 2013/0320560 A1 | 12/2013 | Secker et al. | |
| 2013/0346781 A1 | 12/2013 | Chung et al. | |
| 2014/0006817 A1 | 1/2014 | Bonen et al. | |
| 2014/0026146 A1 | 1/2014 | Jahagirdar et al. | |
| 2014/0208041 A1* | 7/2014 | Hyde | G11C 7/1006 711/146 |
| 2014/0217604 A1* | 8/2014 | Chou | H01L 25/50 257/774 |
| 2014/0217616 A1 | 8/2014 | Choi | |
| 2014/0371109 A1 | 12/2014 | McMillen et al. | |
| 2015/0091131 A1 | 4/2015 | Lamorey et al. | |
| 2015/0277532 A1 | 10/2015 | Mishaeli et al. | |
| 2015/0279431 A1 | 10/2015 | Li et al. | |
| 2016/0126291 A1 | 5/2016 | Lu et al. | |
| 2016/0357630 A1 | 12/2016 | Kang et al. | |
| 2017/0018301 A1 | 1/2017 | Kilmer et al. | |
| 2017/0062383 A1 | 3/2017 | Yee et al. | |
| 2017/0077387 A1 | 3/2017 | Kan et al. | |
| 2017/0084312 A1 | 3/2017 | Kim | |
| 2017/0084596 A1 | 3/2017 | Scanlan | |
| 2017/0139635 A1 | 5/2017 | Jayasena et al. | |
| 2017/0178711 A1 | 6/2017 | Morris et al. | |
| 2017/0300269 A1 | 10/2017 | Um et al. | |
| 2018/0082981 A1* | 3/2018 | Gowda | H01L 24/10 |
| 2018/0095750 A1 | 4/2018 | Drysdale et al. | |
| 2018/0107630 A1 | 4/2018 | Zhou et al. | |
| 2018/0240964 A1 | 8/2018 | Nikonov et al. | |
| 2018/0254073 A1 | 9/2018 | Frans | |
| 2018/0277695 A1 | 9/2018 | Garten et al. | |
| 2018/0330236 A1 | 11/2018 | Hou | |
| 2018/0350773 A1 | 12/2018 | Saito | |
| 2019/0042251 A1 | 2/2019 | Nurvitadhi et al. | |
| 2019/0050040 A1 | 2/2019 | Baskaran et al. | |
| 2019/0051642 A1* | 2/2019 | Gupta Hyde | G06F 1/3296 |
| 2019/0065204 A1 | 2/2019 | Jean | |
| 2019/0065956 A1 | 2/2019 | Qian et al. | |
| 2019/0096453 A1 | 3/2019 | Shin et al. | |
| 2019/0102330 A1 | 4/2019 | Hasbun et al. | |
| 2019/0103143 A1 | 4/2019 | Hasbun et al. | |
| 2019/0103148 A1 | 4/2019 | Hasbun et al. | |
| 2019/0114535 A1 | 4/2019 | Ng et al. | |
| 2019/0164834 A1 | 5/2019 | Or-Bach et al. | |
| 2019/0187898 A1 | 6/2019 | Gu et al. | |
| 2019/0198083 A1 | 6/2019 | Biswas et al. | |
| 2019/0205244 A1 | 7/2019 | Smith | |
| 2019/0220434 A1 | 7/2019 | Dai et al. | |
| 2019/0229101 A1 | 7/2019 | Lee | |
| 2019/0259732 A1* | 8/2019 | Choo | H01L 25/0652 |
| 2019/0267074 A1 | 8/2019 | Fishburn et al. | |
| 2019/0279697 A1 | 9/2019 | Karpov et al. | |
| 2019/0318975 A1 | 10/2019 | Shi et al. | |
| 2019/0334010 A1 | 10/2019 | Avci et al. | |
| 2020/0006324 A1 | 1/2020 | Chen et al. | |
| 2020/0076424 A1 | 3/2020 | Dubey et al. | |
| 2020/0098725 A1 | 3/2020 | Liff et al. | |
| 2020/0107444 A1 | 4/2020 | Hoe et al. | |
| 2020/0126995 A1 | 4/2020 | Ge et al. | |
| 2020/0135697 A1 | 4/2020 | Brewer | |
| 2020/0159568 A1 | 5/2020 | Goyal et al. | |
| 2020/0161230 A1 | 5/2020 | Knickerbocker et al. | |
| 2020/0168528 A1 | 5/2020 | Cheah et al. | |
| 2020/0168550 A1 | 5/2020 | Ryu et al. | |
| 2020/0168554 A1 | 5/2020 | Fay et al. | |
| 2020/0279793 A1 | 9/2020 | Xie et al. | |
| 2020/0303343 A1* | 9/2020 | Manipatruni | G11C 7/1006 |
| 2020/0303344 A1* | 9/2020 | Manipatruni | H01L 24/73 |
| 2020/0334082 A1 | 10/2020 | Zhao et al. | |
| 2020/0365593 A1 | 11/2020 | Chen et al. | |
| 2021/0134724 A1 | 5/2021 | Rubin et al. | |
| 2021/0160061 A1 | 5/2021 | Liu et al. | |
| 2021/0166740 A1* | 6/2021 | Shin | G06F 3/0625 |
| 2021/0311629 A1 | 10/2021 | Pappachan et al. | |
| 2021/0335718 A1 | 10/2021 | Cheah et al. | |
| 2021/0391469 A1 | 12/2021 | Doornbos et al. | |
| 2022/0367400 A1 | 11/2022 | Li | |

(56) References Cited

U.S. PATENT DOCUMENTS

| | | |
|---|---|---|
| 2023/0004324 A1 | 1/2023 | Lim et al. |
| 2023/0086010 A1 | 3/2023 | Gonzalez et al. |

FOREIGN PATENT DOCUMENTS

| | | | |
|---|---|---|---|
| JP | H11168185 A | 6/1996 | |
| JP | 2000196008 A | 7/2000 | |
| JP | 2004315268 A | 11/2004 | |
| JP | 2006324430 A | 11/2004 | |
| JP | 2007150154 A | 1/2009 | |
| JP | 2010053399 | 3/2010 | |
| JP | 2018160490 A | 10/2018 | |
| KR | 1020100081272 | 7/2010 | |
| KR | 20200066538 A | 6/2020 | |
| TW | 201327740 | 1/2013 | |
| TW | 201430968 | 8/2014 | |
| TW | 201523827 A | 6/2015 | |
| TW | 201843782 B | 2/2020 | |
| WO | 2018126073 A1 | 7/2018 | |
| WO | 2018220846 A1 | 12/2018 | |
| WO | 2019023253 A1 | 1/2019 | |
| WO | 2020062312 A1 | 4/2020 | |

OTHER PUBLICATIONS

Advisory Action notified Mar. 3, 2021 for U.S. Appl. No. 16/357,265.
Advisory Action notified Mar. 3, 2021 for U.S. Appl. No. 16/357,272.
Final Office Action notified Dec. 28, 2020 for U.S. Appl. No. 16/357,265.
Final Office Action notified Dec. 31, 2020 for U.S. Appl. No. 16/357,272.
International Search Report & Written Opinion notified Jun. 11, 2020 for PCT Patent Application No. PCT/US2020/018875.
International Search Report & Written Opinion notified Sep. 1, 2020 for PCT Patent Application No. PCT/US2020/032974.
Non-Final Office Action notified Jul. 20, 2020 for U.S. Appl. No. 16/357,272.
Non-Final Office Action notified Jul. 22, 2020 for U.S. Appl. No. 16/357,265.
Non-Final Office Action notified Mar. 22, 2021 for U.S. Appl. No. 16/357,265.
Non-Final Office Action notified Mar. 23, 2021 for U.S. Appl. No. 16/357,272.
Non-Final Office Action notified Sep. 3, 2020 for U.S. Appl. No. 16/428,885.
Non-Final Office Action notified Sep. 3, 2020 for U.S. Appl. No. 16/428,893.
Notice of Allowance notified Feb. 22, 2020 for U.S. Appl. No. 16/428,885.
Restriction Requirement mailed Dec. 13, 2019 for U.S. Appl. No. 16/357,265.
Restriction Requirement notified Jan. 2, 20 for U.S. Appl. No. 16/357,272.
Restriction Requirement notified Apr. 3, 2020 for U.S. Appl. No. 16/428,885.
Restriction Requirement notified Apr. 3, 2020 for U.S. Appl. No. 16/428,893.
Jun, H. et al., "HBM (High Bandwidth Memory) DRAM Technology and Architecture", 2017 IEEE International Memory Workshop (IMW), Monterey, CA, 2017, pp. 1-4.
Kim, J. et al., "A 1.2 V 12.8 GB/s 2 GB Mobile Wide-I/O DRAM With 4$\times$128 I/Os Using TSV Based Stacking", IEEE Journal of Solid-State Circuits, vol. 47, No. 1, pp. 107-116, Jan. 2012.
Lee, D. et al., "A 1.2V 8Gb 8-channel 128GB/s high-bandwidth memory (HBM) stacked DRAM with effective microbump I/O test methods using 29nm process and TSV", 2014 IEEE International Solid-State Circuits Conference Digest of Technical Papers (ISSCC), San Francisco, CA, 2014, pp. 432-433.
Macri, J., "AMD's next generation GPU and high bandwidth memory architecture: FURY", 2015 IEEE Hot Chips 27 Symposium (HCS), Cupertino, CA, 2015, pp. 1-26.
Pugsley et al., "NDC: Analyzing the impact of 3D-stacked memory+ logic devices on MapReduce workloads", 2014 IEEE International Symposium on Performance Analysis of Systems and Software (ISPASS), Monterey, CA, 2014, pp. 190-200.
Shulaker et al., "Monolithic 3D integration of logic and memory: Carbon nanotube FETs, resistive RAM, and silicon FETs", 2014 IEEE International Electron Devices Meeting, San Francisco, CA, 2014, pp. 27.4.1-27.4.4.
Sun et al., "A novel architecture of the 3D stacked MRAM L2 cache for CMPs", 2009 IEEE 15th International Symposium on High Performance Computer Architecture, Raleigh, NC, 2009, pp. 239-249.
Woo et al., "An optimized 3D-stacked memory architecture by exploiting excessive, high-density TSV bandwidth", HPCA—16 2010 The Sixteenth International Symposium on High-Performance Computer Architecture, Bangalore, 2010, pp. 1-12.
Yu, D., "Wafer level system integration for SiP", 2014 IEEE International Electron Devices Meeting, San Francisco, CA, 2014, pp. 27.1.1-27.1.4.
International Preliminary Report on Patentability notified Sep. 30, 2021 for PCT Patent Application No. PCT/US2020/018875.
AMD CDNA whitepaper. Retrieved from https://www.amd.com/system/files/documents/amd-cdna-whitepaper.pdf [Sep. 14, 2021].
AMD's V-cache product announcement. Retrieved from https://www.pcworld.com/article/3620871/amd-v-cache-for-ryzen-everything-you-need-to-know.html [Sep. 14, 2021].
Chen et al. "System on integrated chips (SoIC (TM) for 3D heterogeneous integration." 2019 IEEE 69th Electronic Components and Technology Conference (ECTC). IEEE, 2019.
Chen et al. "Ultra high density SoIC with sub-micron bond pitch." 2020 IEEE 70th Electronic Components and Technology Conference (ECTC). IEEE, 2020.
Herbert et al., "Analysis of dynamic voltage/frequency scaling in chip-multiprocessors." Proceedings of the 2007 International symposium on Low power electronics and design (ISLPED'07). IEEE, 2007.
Ingerly et al. "Foveros: 3D integration and the use of face-to-face chip stacking for logic devices." 2019 IEEE International Electron Devices Meeting (IEDM). IEEE, 2019.
Lee et al. "Heterogeneous System-Level Package Integration-Trends and Challenges." 2020 IEEE Symposium on VLSI Technology. IEEE, 2020.
Prasad et al. "Buried power rails and back-side power grids: Arm® CPU power delivery network design beyond 5nm." 2019 IEEE International Electron Devices Meeting (IEDM). IEEE, 2019.
Rotem et al. "Power-management architecture of the intel microarchitecture code-named sandy bridge." IEEE micro 32.2 (2012): 20-27.
Decision of Rejection notified May 18, 2021 for Taiwan Patent Application No. 109106755.
Notice of Allowance notified Jul. 9, 2021 for U.S. Appl. No. 16/428,893.
Notice of Allowance notified Jul. 22, 2021 for U.S. Appl. No. 16/357,265.
Notice of Allowance notified Jul. 22, 2021 for U.S. Appl. No. 16/357,272.
International Preliminary Report on Patentability notified Dec. 9, 2021 for PCT Patent Application No. PCT/US2020/032974.
Advisory Action notified Jan. 5, 2023 for U.S. Appl. No. 16/823,209.
Advisory Action notified Jun. 14, 2023 for U.S. Appl. No. 16/823,209.
Advisory Action notified Mar. 15, 2023 for U.S. Appl. No. 17/472,308.
Advisory Action notified Mar. 15, 2023 for U.S. Appl. No. 17/472,325.
Coskun et al., "Temperature- and Cost-Aware Design of 3D Multiprocessor Architectures," 2009 12th Euromicro Conference on Digital System Design, Architectures, Methods and Tools, Patras, Greece, 2009, pp. 183-190, doi: 10.1109/DSD.2009.233 (8 pages).
Ex Parte Quayle Action notified Aug. 24, 2023 for U.S. Appl. No. 17/408,251.
Final Office Action notified Apr. 17, 2023 for U.S. Appl. No. 17/499,241.

(56) References Cited

OTHER PUBLICATIONS

Final Office Action notified Apr. 19, 2023 for U.S. Appl. No. 16/823,209.
Final Office Action notified Feb. 14, 2023 for U.S. Appl. No. 17/472,308.
Final Office Action notified Feb. 14, 2023 for U.S. Appl. No. 17/472,325.
Final Office Action notified Oct. 17, 2022 for U.S. Appl. No. 16/823,209.
Final Office Action notified Oct. 24, 2023 for U.S. Appl. No. 17/472,330.
First Office Action in Re-Examination notified Jul. 11, 2022 for Taiwan Patent Application No. 109106755.
Koob et al., "Design of a 3-D fully depleted SOI computational RAM," in IEEE Transactions on Very Large Scale Integration ( VLSI) Systems, vol. 13, No. 3, pp. 358-369, Mar. 2005, doi: 10.1109/TVLSI.2004.842890 (12 pages).
Lewis et al., "Testing Circuit-Partitioned 3D IC Designs," 2009 IEEE Computer Society Annual Symposium on VLSI, Tampa, FL, USA, 2009, pp. 139-144, doi: 10.1109/ISVLSI.2009.48 (6 pages).
Lexinnova, 3D Stacked Memory, retrieved from the Internet by USPTO 2017, 23 pages.
Non-Final Office Action notified Apr. 20, 2023 for U.S. Appl. No. 17/472,308.
Non-Final Office Action notified Apr. 20, 2023 for U.S. Appl. No. 17/472,325.
Non-Final Office Action notified Aug. 30, 2023 for U.S. Appl. No. 17/230,889.
Non-Final Office Action notified Jan. 31, 2023 for U.S. Appl. No. 16/823,209.
Non-Final Office Action notified Jul. 6, 2023 for U.S. Appl. No. 17/229,50.
Non-Final Office Action notified Mar. 3, 2023 for U.S. Appl. No. 17/449,240.
Non-Final Office Action notified Mar. 24, 2023 for U.S. Appl. No. 17/408,326.
Non-Final Office Action notified May 9, 2023 for U.S. Appl. No. 17/408,323.
Non-Final Office Action notified May 15, 2023 for U.S. Appl. No. 17/472,330.
Non-Final Office Action notified May 24, 2022 for U.S. Appl. No. 16/823,209.
Non-Final Office Action notified Oct. 5, 2022 for U.S. Appl. No. 17/472,308.
Non-Final Office Action notified Oct. 5, 2023 for U.S. Appl. No. 17/229,754.
Non-Final Office Action notified Oct. 6, 2022 for U.S. Appl. No. 17/472,325.
Non-Final Office Action notified Sep. 6, 2023 for Taiwan Patent Application No. 112127062.
Non-Final Office Action notified Sep. 15, 2023 for U.S. Appl. No. 17/408,326.
Non-Final Office Action notified Sep. 26, 2022 for U.S. Appl. No. 17/390,829.
Notice of Allowance notified Apr. 13, 2023 for U.S. Appl. No. 17/478,841.
Notice of Allowance notified Jul. 12, 2023 for U.S. Appl. No. 16/823,209.
Notice of Allowance notified Jul. 12, 2023 for U.S. Appl. No. 17/499,241.
Notice of Allowance notified Jul. 18, 2023 for Japanese Patent Application No. 2021-546863.
Notice of Allowance notified Jul. 27, 2023 for U.S. Appl. No. 17/229,750.
Notice of Allowance notified Jun. 6, 2023 for U.S. Appl. No. 17/472,308.
Notice of Allowance notified Jun. 6, 2023 for U.S. Appl. No. 17/472,325.
Notice of Allowance notified Jun. 29, 2023 for U.S. Appl. No. 17/407,094.
Notice of Allowance notified May 10, 2023 for U.S. Appl. No. 17/396,585.
Notice of Allowance notified Nov. 23, 2022 for U.S. Appl. No. 17/390,829.
Notice of Allowance notified Sep. 11, 2023 for Taiwan Patent Application No. 111129893.
Notice of Allowance notified Sep. 21, 2022 for Taiwan Patent Application No. 109106755.
Notice of Allowance notified Sep. 28, 2022 for U.S. Appl. No. 17/390,799.
Notice of Allowance notified Sep. 29, 2023 for U.S. Appl. No. 17/408,251.
Notice of Reasons for Rejection notified Nov. 8, 2022 for Japanese Patent Application No. 2021-546863.
Office Action notified Feb. 21, 2023 for Japanese Patent Application No. 2021-546863.
Office Action notified May 8, 2023 for Taiwan Patent Application No. 111129893.
Restriction Requirement notified Feb. 8, 2023 for U.S. Appl. No. 17/229,750.
First Office Action notified Jan. 9, 2024 for Taiwan Patent Application No. 112147200.
Notice of Allowance notified Jan. 8, 2024 for Taiwan Patent Application No. 112127062.
Advisory Action notified Jan. 25, 2024 for U.S. Appl. No. 17/408,323.
Advisory Action notified Jan. 25, 2024 for U.S. Appl. No. 17/472,330.
Final Office Action notified Dec. 22, 2023 for U.S. Appl. No. 17/230,889.
Final Office Action notified Oct. 27, 2023 for U.S. Appl. No. 17/408,323.
Non-Final Office Action notified Dec. 15, 2023 for U.S. Appl. No. 17/229,743.
Oya et al., "A Majority-Logic Device Using an Irreversible Single-Electron Box," IEEE Transaction on Nanotechnology, vol. 2, No. I, Mar. 2003, pp. 15-22 (9 pages).

\* cited by examiner

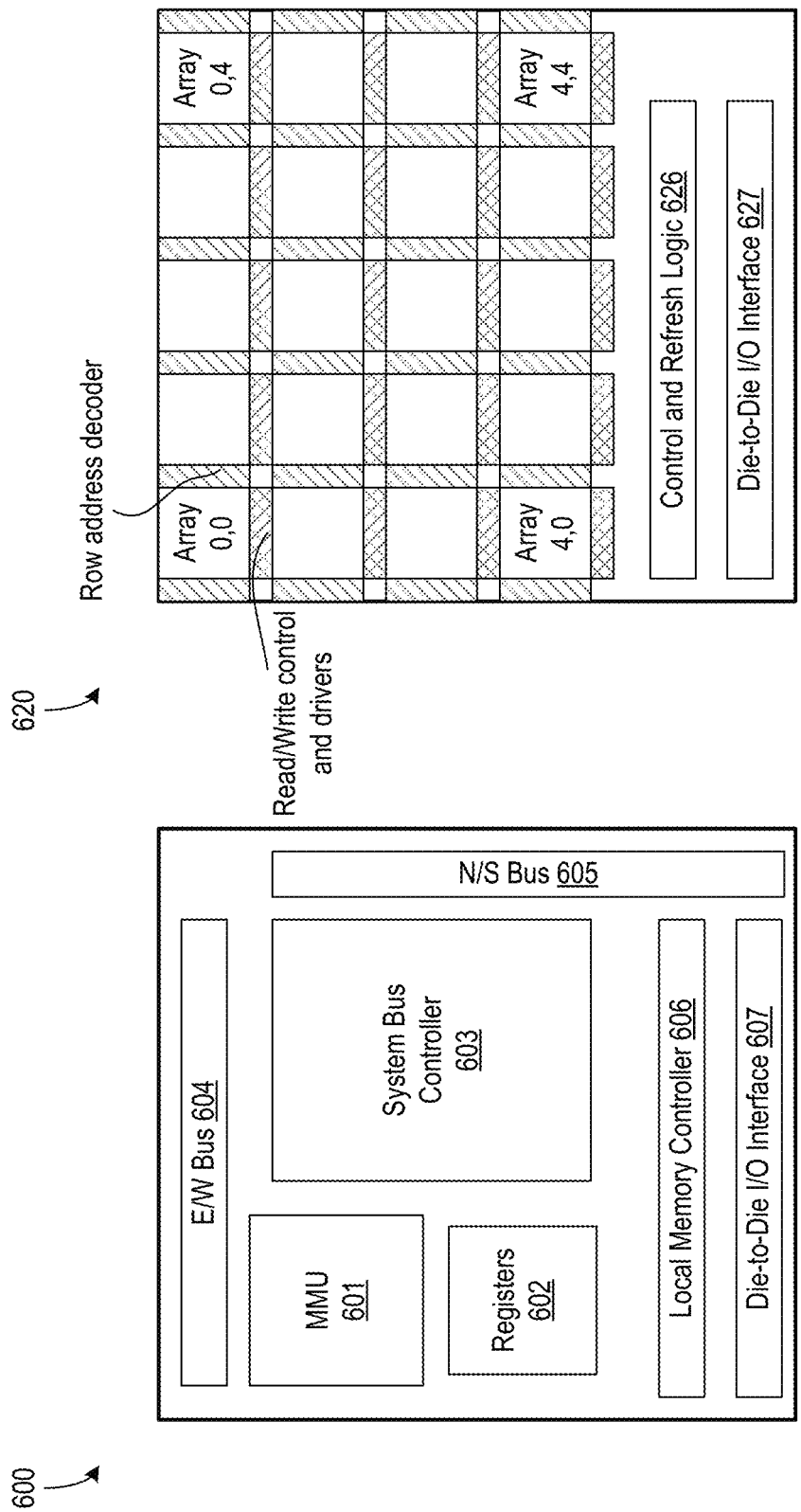

| Memory Die | | | | |
|---|---|---|---|---|
| CH3 | CH7 | CH11 | CH15 | CH19 |
| CH2 | CH6 | CH10 | CH14 | CH18 |
| CH1 | CH5 | CH9 | CH13 | CH17 |
| CH0 | CH4 | CH8 | CH12 | CH16 |

1600

Fig. 16

METHOD OF FORMING AN ARTIFICIAL INTELLIGENCE PROCESSOR WITH THREE-DIMENSIONAL STACKED MEMORY

CLAIM OF PRIORITY

This application is a continuation of U.S. patent application Ser. No. 16/428,885 filed May 31, 2019, titled "3D Integrated Ultra High-Bandwidth Memory," and now issued as U.S. Pat. No. 11,043,472 on Jun. 22, 2021, which is incorporated by reference in its entirety.

BACKGROUND

Artificial intelligence (AI) is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. There is a desire to reduce latency of computing the training model and using the training model, and to reduce the power consumption of such AI processor systems.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 6A illustrates a unit cell (or processing element (PE)) of a compute die which is configured to couple with a memory die below it, in accordance with some embodiments.

FIG. 6B illustrates a unit cell of a memory die which is configured to couple with a compute die above it, in accordance with some embodiments.

FIG. 16 illustrates an apparatus showing partitioning of the memory die in a plurality of channels, in accordance with some embodiments.

DETAILED DESCRIPTION

Figure 1:
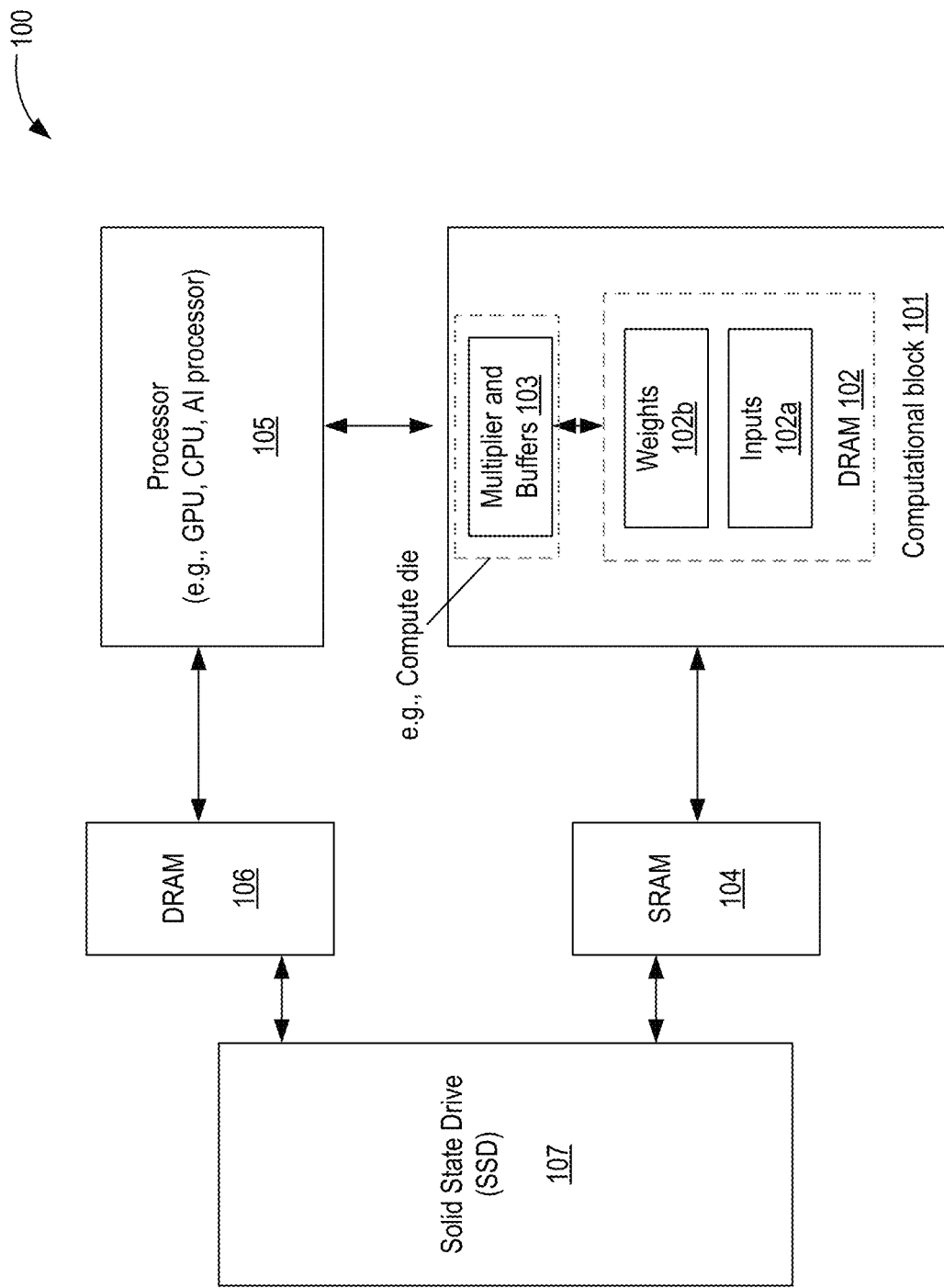
FIG. 1 illustrates a high-level architecture of an artificial intelligence (AI) machine comprising a compute die positioned on top of a memory die, in accordance with some embodiments.

Existing packaging technology that stacks a dynamic random-access memory (DRAM) on top of a compute die results in limited I/O bandwidth due to periphery constraints. These periphery constraints come from vertical interconnect or pillars between a package substrate and the DRAM die. Further, having the compute die below the DRAM causes thermal issues for the compute die because any heat sink is closer to the DRAM and away from the compute die. Even with wafer-to-wafer bonded DRAM and compute die in a package results in excessive perforation of the compute die because the compute die is stacked below the DRAM. These perforations are caused by through-silicon vias (TSVs) that couple the C4 bumps adjacent to the compute die with the micro-bumps, Cu-to-Cu pillars, or hybrid Cu-to-Cu pillars between the DRAM die and the compute die. When the DRAM die is positioned above the compute die in a wafer-to-wafer configuration, the TSV density is lined directly to die-to-die I/O counts, which is substantially similar to the number of micro-bumps (or Cu-to-Cu pillars) between the DRAM die and the compute die. Further, having the compute die below the DRAM die in a wafer-to-wafer coupled stack, causes thermal issues for the compute die because the heat sink is closer to the DRAM die and away from the compute die. Placing the memory as high bandwidth memory (HBM) on either side of the compute die does not resolve the bandwidth issues with stacked compute and DRAM dies because the bandwidth is limited by the periphery constraints from the number of I/Os on the sides of the HBMs and the compute die.

Some embodiments describe a packaging technology to improve performance of an AI processing system resulting in an ultra-high bandwidth AI processing system. In some embodiments, an integrated circuit package is provided which comprises: a substrate; a first die on the substrate, and a second die stacked over the first die, wherein the first die comprises memory and the second die comprises computational logic. In some embodiments, the first die comprises dynamic access memory (DRAM) having bit-cells, wherein each bit-cell comprises an access transistor and a capacitor.

In other embodiments, the DRAM below the compute die can be replaced with or supplemented with other fast access memories like ferroelectric RAM (FeRAM), static random-access memory (SRAM), and other non-volatile memories such as flash, NAND, magnetic RAM (MRAM), Fe-SRAM, Fe-DRAM, and other resistive RAMs (Re-RAMs), etc. The memory of the first die may store input data and weight factors. The computational logic of the second die is coupled to the memory of the first die. The second die can be an inference die that applies fixed weights for a trained model to an input data to generate an output. In some embodiments, the second die includes processing cores (or processing entities (PEs)) that have matrix multipliers, adders, buffers, etc. In some embodiments, first die comprises a high bandwidth memory (HBM). HBM may include a controller and memory arrays.

In some embodiments, the second die includes an application specific integrated circuit (ASIC) which can train the model by modifying the weights and also use the model on new data with fixed weights. In some embodiments, the memory comprises a DRAM. In some embodiments, the memory comprises an SRAM (static random-access memory). In some embodiments, the memory of the first die comprises MRAM (magnetic random-access memory). In some embodiments, the memory of the first die comprises Re-RAM (resistive random-access memory). In some embodiments, the substrate is an active interposer, and the first die is embedded in the active interposer. In some embodiments, the first die is an active interposer itself.

In some embodiments, the integrated circuit package is a package for a system-on-chip (SOC). The SOC may include a compute die on top of a memory die; an HBM, and a processor die coupled to memory dies adjacent to it (e.g., on top of or on the side of the processor die). In some embodiments, the SOC include a solid-state memory die.

There are many technical effects of the packaging technology of various embodiments. For example, by placing the memory die below the compute die, or by placing one or more memory dies on the side(s) of the compute die, AI system performance improves. The thermal issues related to having compute die being away from the heat sink are addressed by placing the memory below the compute die. Ultra high-bandwidth between the memory and compute dies is achieved by tight micro-bump spacing between the two dies. In existing systems, the bottom die is highly perforated by TSVs to carry signals to and from active devices of the compute die to the active devises of the memory die via the micro-bumps. By placing the memory die below the compute die such that their active devices are positioned closer to one another (e.g., face-to-face), the perforation requirement for the bottom die is greatly reduced. This is because the relation between the number of micro-bumps and the TSVs is decoupled. For example, the die-to-die I/O density is independent of the TSV density. The TSVs though the memory die are used to provide power and ground, and signals from a device external to the package. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal," and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" or BE generally refers to a section of a die which is opposite of a "frontend" or FE and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a high-level architecture of an artificial intelligence (AI) machine 100 comprising a compute die positioned on top of a memory die, in accordance with some embodiments. AI machine 100 comprises computational block 101 or processor having random-access memory (RAM) 102 and computational logic 103; static random-access memory (SRAM) 104, main processor 105, dynamic random-access memory (DRAM) 106, and solid-state memory or drive (SSD) 107. In some embodiments, some or all components of AI machine 100 are packaged in a single package forming a system-on-chip (SOC). In some embodiments, computational block 101 is packaged in a single package and then coupled to processor 105 and memories 104, 106, and 107 on a printed circuit board (PCB). In various embodiments, computational block 101 comprises a special purpose compute die 103 or microprocessor. In some embodiments, RAM 102 is DRAM which forms a special memory/cache for the special purpose compute die 103. The DRAM can be embedded DRAM (eDRAM) such as IT-1C (one transistor and one capacitor) based memories. In some embodiments, RAM 102 is ferroelectric RAM (Fe-RAM).

In some embodiments, compute die 103 is specialized for applications such as Artificial Intelligence, graph processing, and algorithms for data processing. In some embodiments, compute die 103 further has logic computational blocks, for example, for multipliers and buffers, a special data memory block (e.g., buffers) comprising DRAM. In some embodiments, DRAM 102 has weights and inputs stored in-order to improve the computational efficiency. The interconnects between processor 105 (also referred to as special purpose processor), SRAM 104 and compute die 103 are optimized for high bandwidth and low latency. In some embodiments, SRAM 104 is replaced by Fe-RAM. The architecture of FIG. 1 allows efficient packaging to lower the energy/power/cost and provides for ultra-high bandwidth between DRAM 102 and compute block of 101.

In some embodiments, RAM 102 comprises DRAM which is partitioned to store input data (or data to be processed) 102a and weight factors 102b. In some embodiments, RAM 102 comprises Fe-RAM. For example, RAM 102 comprises FE-DRAM or FE-SRAM. In some embodiments, input data 102a is stored in a separate memory (e.g., a separate memory die) and weight factors 102b are stored in a separate memory (e.g., separate memory die).

In some embodiments, computational logic 103 comprises matrix multiplier, adder, concatenation logic, buffers, and combinational logic. In various embodiments, computational logic 103 performs multiplication operation on inputs 102a and weights 102b. In some embodiments, weights 102b are fixed weights. For example, processor 105 (e.g., a graphics processor unit (GPU), field programmable grid array (FPGA) processor, application specific integrated circuit (ASIC) processor, digital signal processor (DSP), an AI processor, a central processing unit (CPU), or any other high performance processor) computes the weights for a training model. Once the weights are computed, they are stored in memory 102b. In various embodiments, the input data, that is to be analyzed using a trained model, is processed by computational block 101 with computed weights 102b to generate an output (e.g., a classification result).

In some embodiments, SRAM 104 is ferroelectric based SRAM. For example, a six transistor (6T) SRAM bit-cells having ferroelectric transistors are used to implement a non-volatile Fe-SRAM. In some embodiments, SSD 107 comprises NAND flash cells. In some embodiments, SSD 107 comprises NOR flash cells. In some embodiments, SSD 107 comprises multi-threshold NAND flash cells.

In various embodiments, the non-volatility of Fe-RAM is used to introduce new features such as security, functional safety, and faster reboot time of architecture 100. The non-volatile Fe-RAM is a low power RAM that provides fast access to data and weights. Fe-RAM 104 can also serve as a fast storage for inference die 101 (or accelerator), which typically has low capacity and fast access requirements.

In various embodiments, the Fe-RAM (Fe-DRAM or Fe-SRAM) includes ferroelectric material. The ferroelectric (FE) material may be in a transistor gate stack or in a capacitor of the memory. The ferroelectric material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or lanthanides). In various embodiments, when the FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type $h-RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y). The ferroelectric phase is characterized by a buckling of the layered $MnO5$ polyhedra, accompanied by displacements of the Y ions, which leads to a net electric polarization. In some embodiments, hexagonal FE includes one of: $YMnO_3$ or $LuFeO_3$. In various embodiments, when the FE material comprises hexagonal ferroelectrics, the conductive oxides are of of $A2O3$ (e.g., $In2O3$, $Fe2O3$) and $ABO3$ type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are $LuFeO3$ class of materials or super lattice of ferroelectric and paraelectric materials $PbTiO3$ (PTO) and $SnTiO3$ (STO), respectively, and $LaAlO3$ (LAO) and STO, respectively. For example, a super lattice of [PTO/STO] n or [LAO/STO] n, where 'n' is between 1 and 100. While various embodiments here are described with reference to ferroelectric material for storing the charge state, the embodiments are also applicable for paraelectric material. In some embodiments, memory 104 comprises DRAM instead of Fe-RAM.

Figure 2:
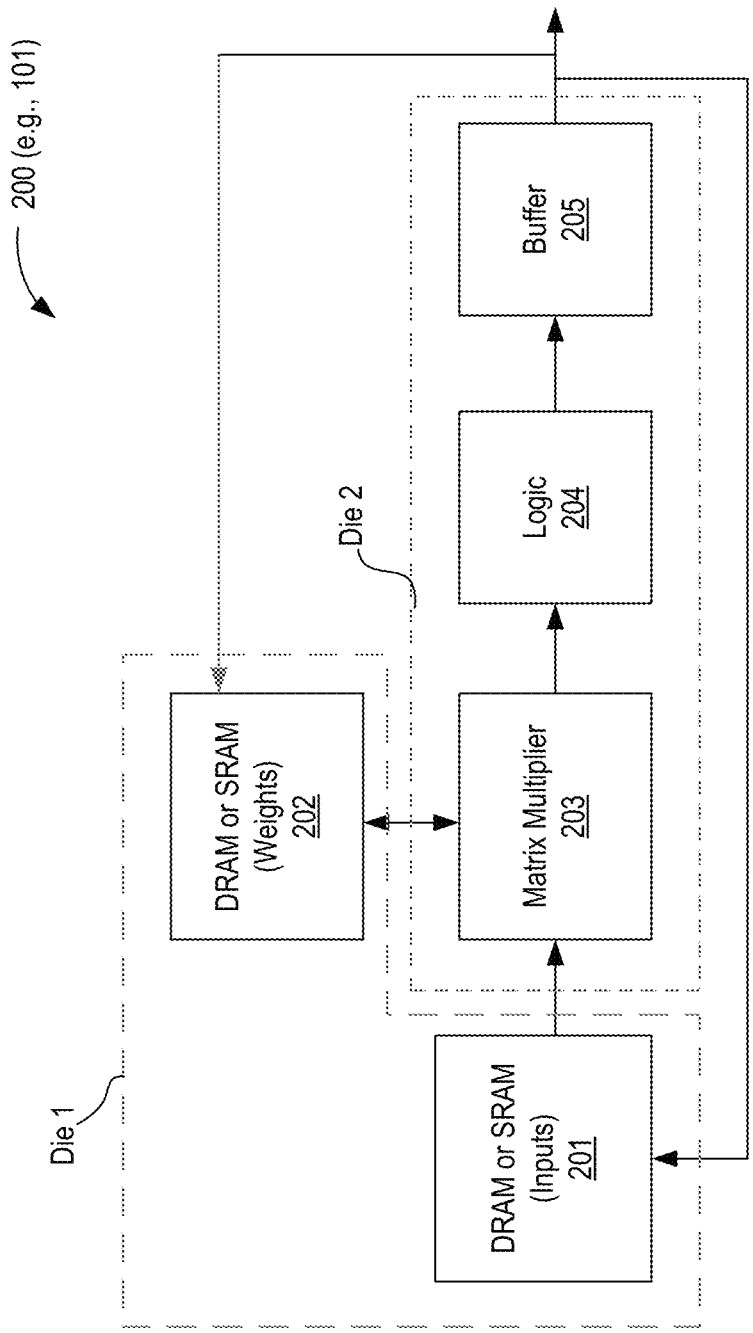
FIG. 2 illustrates an architecture of a computational block comprising a compute die positioned on top of a memory die, in accordance with some embodiments.

FIG. 2 illustrates an architecture of computational block 200 (e.g., 101) comprising a compute die positioned on top of a memory die, in accordance with some embodiments. The architecture of FIG. 2 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 201 to store input data and a second die 202 to store weight factors. In some embodiments, the memory die is a single die that is partitioned such that first partition 201 of the memory die is used to store input data and second partition 202 of the memory die is used to store weights. In some embodiments, the memory die comprises DRAM. In some embodiments, the memory die comprises FE-SRAM or SRAM. In some embodiments, the memory die comprises MRAM. In some embodiments, the memory die comprises SRAM. For example, memory partitions 201 and 202, or memory dies 201 and 202 include one or more of: DRAM, FE-SRAM, FE-DRAM, SRAM, and/or MRAM. In some embodiments, the input data stored in memory partition or die 201 is the data to be analyzed by a trained model with fixed weights stored in memory partition or die 202.

In some embodiments, the compute die comprises matrix multiplier 203, logic 204, and temporary buffer 205. Matrix multiplier 203 performs multiplication operation on input data 'X' and weights 'W' to generate an output 'Y'. This output may be further processed by logic 204. In some embodiments, logic 204 performs: a threshold operation, pooling and drop out operations, and/or concatenation operations to complete the AI logic primitive functions. In some embodiments, the output of logic 204 (e.g., processed output 'Y') is temporarily stored in buffer 205. In some embodiments, buffer 205 is memory such as one or more of: DRAM, Fe-SRAM, Fe-DRAM, MRAM, resistive RAM (Re-RAM) and/or SRAM. In some embodiments, buffer 205 is part of the memory die (e.g., Die 1). In some embodiments, buffer 205 performs the function of a re-timer. In some embodiments, the output of buffer 205 (e.g., processed output 'Y') is used to modify the weights in memory partition or die 202. In one such embodiment, computational block 200 not only operates as an inference circuitry, but also as a training circuitry to train a model. In some embodiments, matrix multiplier 203 includes an array of multiplier cells, wherein the DRAMs 201 and 202 include arrays of memory bit-cells, respectively, wherein each multiplier cell is coupled to a corresponding memory bit-cell of DRAM 201 and/or DRAM 202. In some embodiments, computational block 200 comprises an interconnect fabric coupled to the array of multiplier cells such that each multiplier cell is coupled to the interconnect fabric.

Architecture 200 provides reduced memory accesses for the compute die (e.g., die 2) by providing data locality for weights, inputs and outputs. In one example, data from and to the AI computational blocks (e.g., matrix multiplier 203) is locally processed within a same packaging unit. Architecture 200 also segregates the memory and logic operations on to a memory die (e.g., Die 1) and a logic die (e.g., Die 2), respectively, allowing for optimized AI processing. Desegregated dies allow for improved yield of the dies. A high capacity memory process for Die 1 allows reduction of power of the external interconnects to memory, reduces cost of integration, and also results in a smaller foot-print.

Figure 3A:
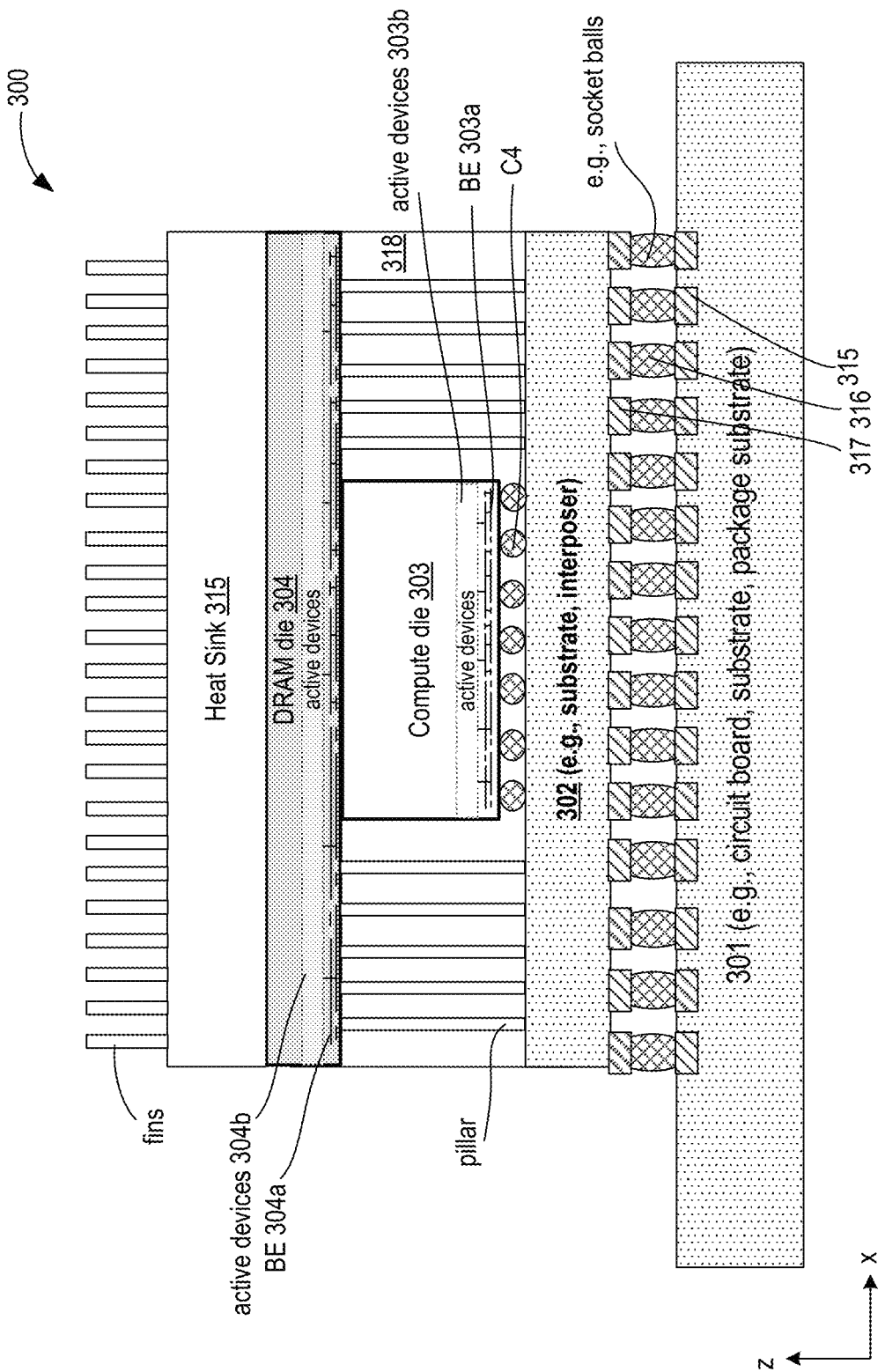
FIG. 3A illustrates a cross-section of a package where the compute die is below the memory die resulting in limited I/O (input-output) bandwidth and thermal issues for the compute die.

FIG. 3A illustrates a cross-section of a package 300 (also referred to as package configuration 300) where a compute die is below a memory die resulting in limited I/O bandwidth and thermal issues for the compute die. In some embodiments, integrated circuitry (IC) package assembly is coupled to circuitry board 301. In some embodiments, circuit board 301 may be a Printed Circuit Board (PCB) composed of an electrically insulative material such as an epoxy laminate. For example, circuit board 301 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material. In some embodiments, layer 301 is a package substrate and is part of the IC package assembly.

The IC package assembly may include substrate 302, compute die 303, and memory die 304. In this case, memory die 304 is above compute die 303. In other embodiments, compute die 303 is coupled to memory die 304 by pillar interconnects such as copper pillars. Memory die 304 communicates with compute die 303 through these pillar interconnects. The pillar interconnects are embedded in a dielectric 318 (or encapsulant 318).

Package substrate 302 may be a coreless substrate. For example, package substrate 302 may be a "bumpless" build-up layer (BBUL) assembly that includes a plurality of "bumpless" build-up layers. Here, the term "bumpless build-up layers" generally refers to layers of substrate and components embedded therein without the use of solder or other attaching means that may be considered "bumps." However, the various embodiments are not limited to BBUL type connections between die and substrate, but can be used for any suitable flip chip substrates. The one or more build-up layers may have material properties that may be altered and/or optimized for reliability, warpage reduction, etc. Package substrate 302 may be composed of a polymer, ceramic, glass, or semiconductor material. Package substrate 302 may be a conventional cored substrate and/or an interposer. Package substrate 302 includes active and/or passive devices embedded therein.

The upper side of package substrate 302 is coupled to compute die 303 via C4 bumps. The lower opposite side of package substrate 302 is coupled to circuit board 301 by package interconnects 317. Package interconnects 316 may couple electrical routing features 317 disposed on the second side of package substrate 302 to corresponding electrical routing features 315 on circuit board 301.

Here, the term "C4" bumps (also known as controlled collapse chip connection) provides a mechanism for interconnecting semiconductor devices. These bumps are typically used in flip-chip packaging technology, but are not limited to that technology.

Package substrate 302 may have electrical routing features formed therein to route electrical signals between compute die 303 (and/or memory die 304) and circuit board 301 and/or other electrical components external to the IC package assembly. Package interconnects 316 and die interconnects 310 include any of a wide variety of suitable structures and/or materials including, for example, bumps, pillars or balls formed using metals, alloys, solderable material, or their combinations. Electrical routing features 315 may be arranged in a ball grid array ("BGA") or other configuration. Compute die 303 and/or memory die 304 includes two or more dies embedded in encapsulant 318. Here, heat sink 315 and associated fins are coupled to memory die 304.

In this example, compute die 303 is coupled to memory die 304 in a front-to-back configuration (e.g., the "front" or "active" side of memory die 304 is coupled to the "back" or "inactive" of compute die 303). The backend (BE) interconnect layers 303a and active device 303b of compute die 303 are closer to the C4 bumps than to DRAM die 304. The BE interconnect layers 304a and active devices 304b (e.g., transistors) of DRAM die 304 are closer to compute die 303 than heat sink 315.

In this example, the stacking of DRAM die 304 on top of compute die 303 is not wafer-to-wafer bonding. This is evident from the different surface areas of the two dies being different. Pillars such as TSVs are used to communicate between circuit board 301, compute die 303, and DRAM die 304. This particular packaging configuration has limited I/O bandwidth because DRAM die 304 and compute die 303 communicate via pillars in the periphery. Signals from compute die 303 are routed via C4 bumps and through substrate 302 and pillars before they reach active devices 304b via BE 304a of DRAM die 304. This long route along with limited number of pillars and C4 bumps limits the overall bandwidth of the AI system. Further, this configuration also suffers from thermal issues because the compute die 303 is not directly coupled to heat sink 315. While heat sink 315 is shown as a thermal solution, other thermal solutions may also be used. For example, fan, or liquid cooling, etc. may be used in addition to or instead of heat sink 315.

Figure 3B:
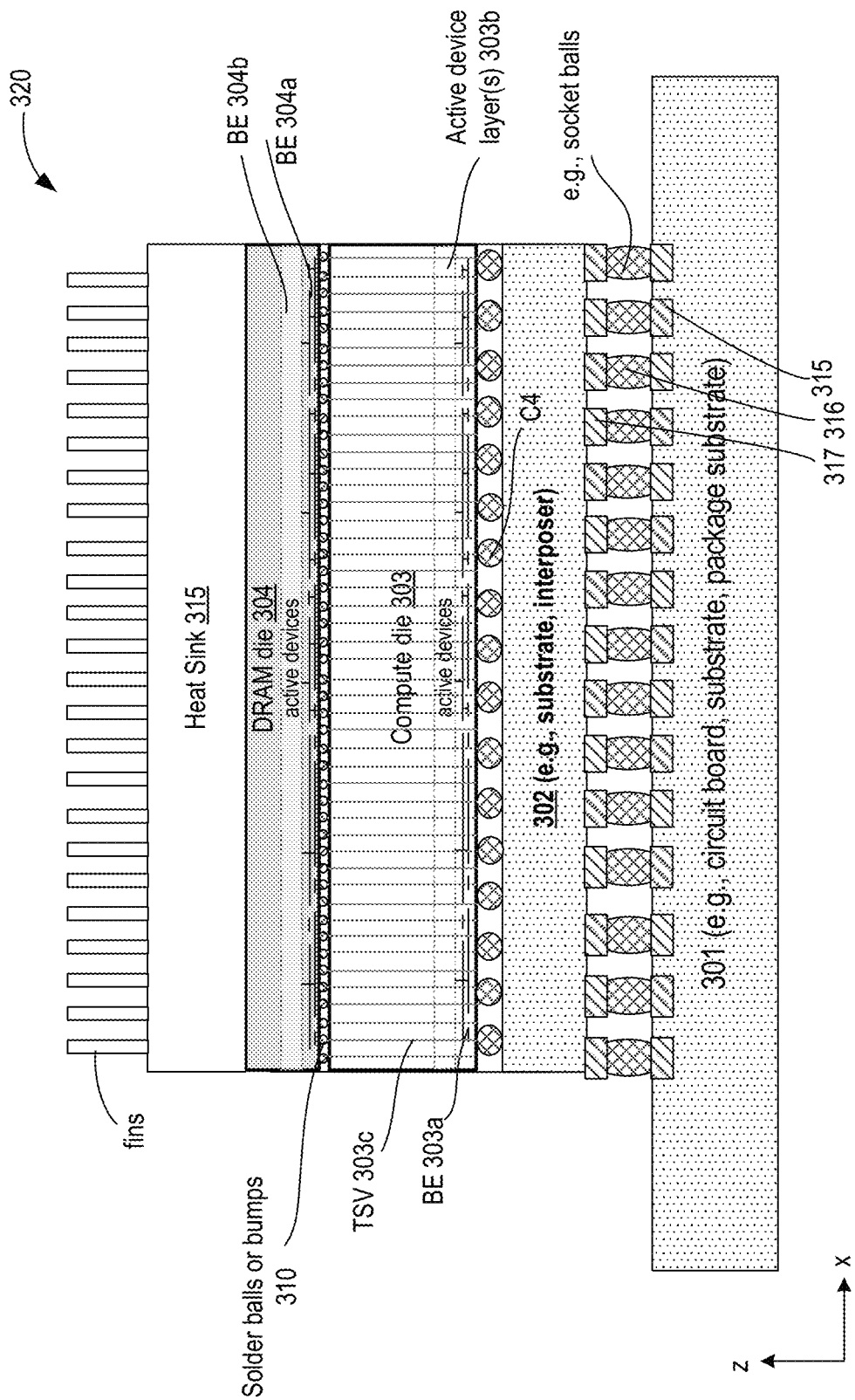
FIG. 3B illustrates a cross-section of a package where the compute die is below the memory die, where the compute die is perforated with high-density through-silicon vias (TSVs) to couple with the bumps between the compute die and the memory die.

FIG. 3B illustrates a cross-section of a package 320 where compute die 303 is below memory die 304, where compute die 303 is perforated with high-density through-silicon vias (TSVs) to couple with the bumps between compute die 303 and memory die 304. In this example, compute die 303 and DRAM die 304 are wafer-to-wafer bonded via solder balls or micro-bumps 310, or any suitable technology. The configuration of package 320 results in higher bandwidth than configuration of package 320. This is because the periphery routing via pillars is replaced with direct routing between bumps 310 and TSVs 303c. In this packaging configuration, the bottom die 303 is highly perforated by TSVs 303b to carry signals to and from active devices of compute die 303 to the active devises of memory die 304 via micro-bumps 310. This perforation is because of a direct link between number of bumps 310 and TSVs 303b. In this case, the number of TSVs is same as number of bumps 310. To increase bandwidth, more bumps and TSVs need to be added. However, increasing TSVs limits the routing in compute die 303. Like the configuration of FIG. 3A, here package configuration 320 also suffers from thermal issues because compute die 303 is not directly coupled to heat sink 315.

Figure 3C:
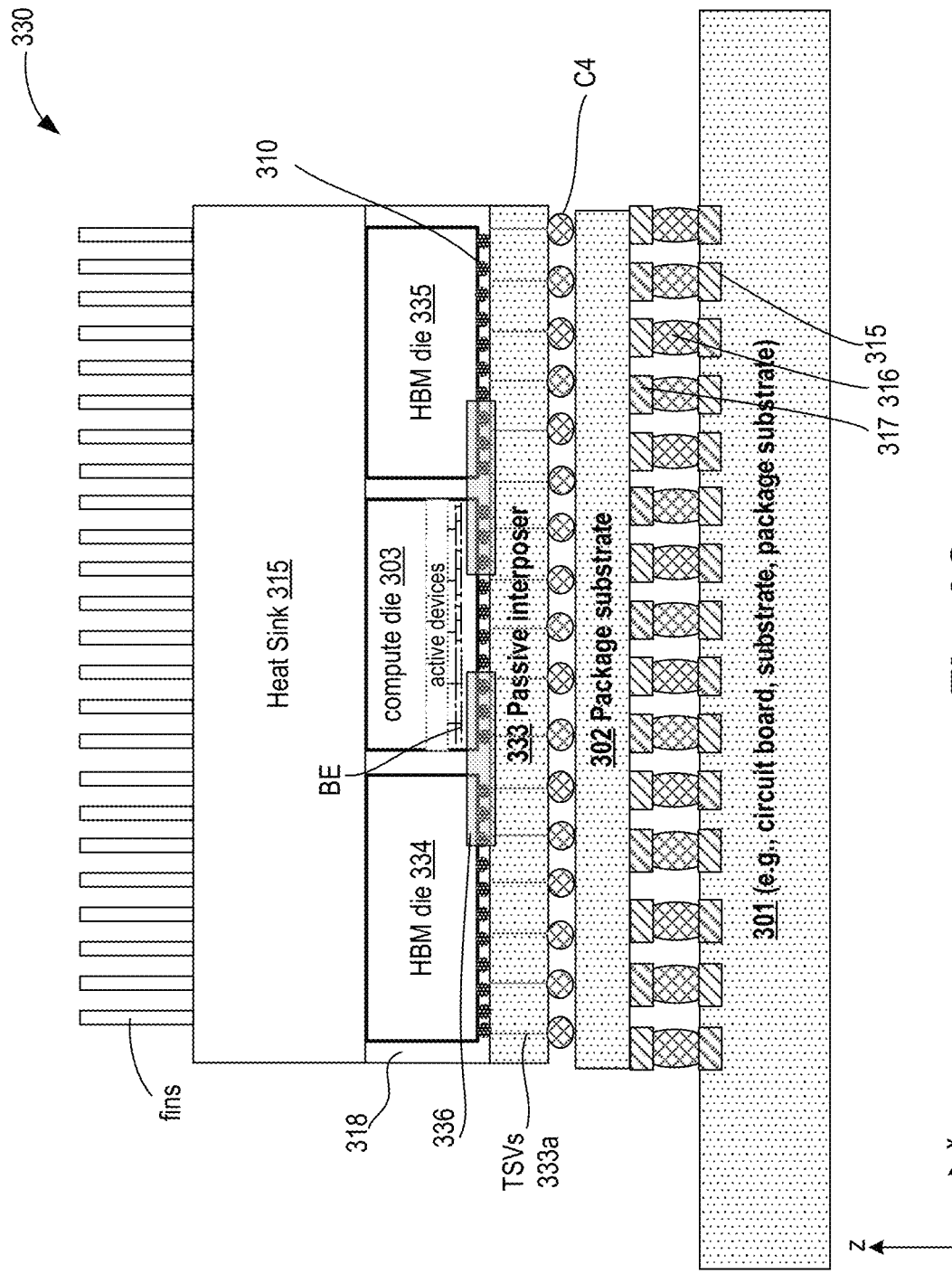
FIG. 3C illustrates a cross-section of a package where high bandwidth memory (HBM) are on either side of the compute die resulting in limited I/O bandwidth due to periphery constraints for number of I/Os.

FIG. 3C illustrates a cross-section of a package 330 where high bandwidth memory (HBM) are on either side of compute die 303 resulting in limited I/O bandwidth due to periphery constraints for number of I/Os. In this case, memory dies are not stacked over compute die 303 but placed adjacent or laterally next to compute die 303 as HBM 334 and 335. The bandwidth of this configuration is limited by periphery constraints in region 326 between bumps 310 of HBM 334/335 and compute die 303. As such, memory access energy is higher than package configuration 320 because memory access is non-uniformly distributed. In this configuration, the number of channels is limited by the number of peripheral I/O count in regions 336.

Figure 4A:
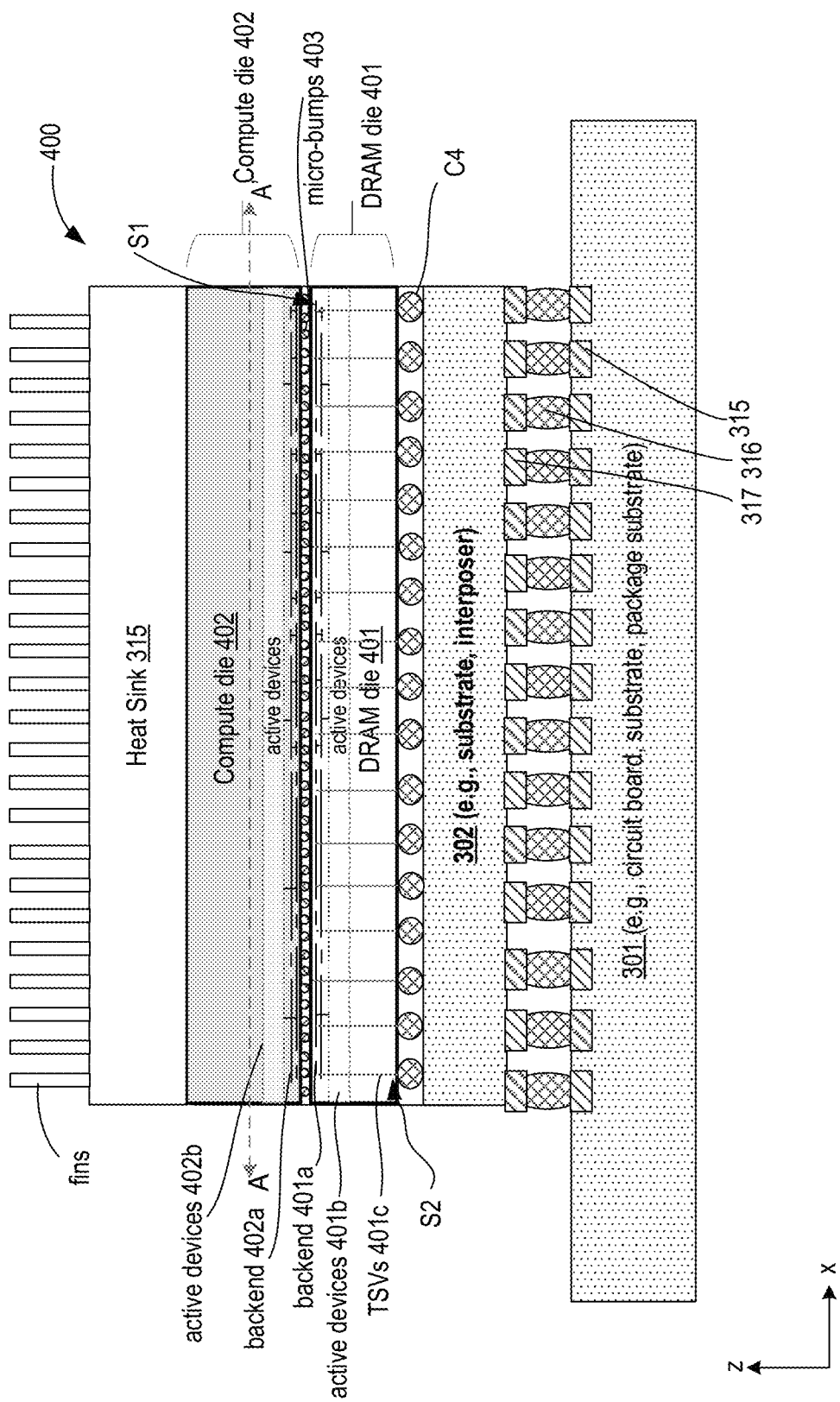
FIG. 4A illustrates a cross-section of a package comprising a computational block, which includes a compute die (e.g., an inference logic die) above a dynamic random-access memory (DRAM) die, in accordance with some embodiments.

FIG. 4A illustrates a cross-section of a package 400 (herein referred to as package configuration 400) comprising a computational block, which includes a compute die (e.g., an inference logic die) above a dynamic random-access memory (DRAM) die, in accordance with some embodiments. This particular topology enhances the overall performance of the AI system by providing ultra-high bandwidth compared to package configurations of FIGS. 3A-C. Compared to FIG. 3B, here DRAM die 401 is positioned under compute die 402 and the two dies are wafer-to-wafer bonded via micro-bumps 403, copper-to-copper (Cu-to-Cu) pillars, hybrid Cu-to-Cu pillars 403. In some embodiments, Cu-to-Cu pillars are fabricated with copper pillars formed on each wafer substrate which is to be bonded together. In various embodiments, a conductive material (e.g., Nickel) is coated between the copper pillars of the two wafer dies.

Dies 401 and 402 are bonded such that their respective BE layers and active devices 401a/b and 402a/b face one another. As such, transistors between the two dies are closest where the die-to-die bonding happens. This configuration reduces the latency because active devices 401a and 402a are closer to one another compared to the active devices 301a and 302a of FIG. 3B.

Compared to the configuration of FIG. 3B. TSVs 401c are decoupled from micro-bumps (or Cu-2-Cu pillars). For example, the number of TSVs 401c are not directly related to the number of micro-bumps 403. As such, memory die TSV perforation requirement is minimized as die-to-die I/O density is independent of TSV density. The ultra high bandwidth also comes from the tight micro-bump spacing. In some embodiments, the micro-bump spacing 403 is tighter than the micro-bump spacing 310 of FIG. 3B because DRAM 401 is not perforated at the same pitch as in compute die 302 of FIG. 3B. For example, in FIG. 3B micro-bump density is dependent on TSV pitch and overall signal routing design of compute die 302. Package configuration 400 has no such limitation.

Here, DRAM die 401 is perforated to form few TSVs 401c that carry DC signals such as power and ground from substrate 302 to compute die 402. External signals (e.g., external to package 400) can also be routed to compute die 402 via TSVs 401c. The bulk of all communication between compute die 402 and DRAM die 401 takes place through micro-bumps 403 or face-to-face interconnects 403. In various embodiments, there is no perforation of compute die 402 because TSVs may not be needed. Even if TSVs were used to route to any additional die (not shown) on top of compute die 402, those number of TSVs are not related to the number of micro-bumps 403 in that they may not have to be the same number. In various embodiments, TSVs 401c pass through active region or layers (e.g., transistor regions) of DRAM die 401.

In various embodiments, compute die 402 comprises logic portions of an inference die. An inference die or chip is used to apply inputs and fixed weights associated with a trained model to generate an output. By separating the memory 401 associated with inference die 402, the AI performance increases. Further, such topology allows for better use of thermal solution such as heat sink 315, which radiates beat away from the power consuming source, inference die 402. While memory for die 401 is illustrated as DRAM 401, different types of memories can also be used. For example, in some embodiments, memory 402 can be one or more of: FE-SRAM, FE-DRAM, SRAM, MRAM, resistance RAM (Re-RAM), embedded DRAM (E.g., IT-IC based memory), or a combination of them. Using FE-SRAM, MRAM, or Re-RAM allows for low power and high-speed memory operation. This allows for placing memory die 401 below compute die 402 to use the thermal solution more efficiently for compute die 402. In some embodiments, memory die 401 is a high bandwidth memory (HBM).

In some embodiments, compute die 402 is an application specific circuit (ASIC), a processor, or some combination of such functions. In some embodiments, one or both of memory die 401 and compute die 402 may be embedded in encapsulant (not shown). In some embodiments, encapsulant can be any suitable material, such as epoxy-based build-up substrate, other dielectric/organic materials, resins, epoxies, polymer adhesives, silicones, acrylics, polyimides, cyanate esters, thermoplastics, and/or thermosets.

The memory circuitry of some embodiments can have active and passive devices in the front side of the die too. Memory die 401 may have a first side S1 and a second side S2 opposite to the first side S1. The first side S1 may be the side of the die commonly referred to as the "inactive" or "back" side of the die. The backside of memory die 401 may include active or passive devices, signals, and power routings, etc. The second side S2 may include one or more transistors (e.g., access transistors), and may be the side of the die commonly referred to as the "active" or "front" side of the die. The second side S2 of memory die 401 may include one or more electrical routing features 310. Compute die 402 may include an "active" or "front" side with one or more electrical routing features connected to micro-bumps 403. In some embodiments, electrical routing features may be bond pads, solder balls, or any other suitable coupling technology.

Compared to package configuration 320, here the thermal issue is mitigated because heat sink 315 is directly attached to compute die 402, which generates most of the heat in this packaging configuration. While the embodiment of FIG. 4A is illustrated as wafer-to-wafer bonding between dies 401 and 402, in some embodiments, these dies can also be bonded using wafer-to-die bonding technologies. Compared to package configuration 320, higher bandwidth is achieved between DRAM die 401 and compute die 402 as higher number of channels are available between memory die 401 and compute die 402. Further, memory access energy is reduced compared to memory access energy of package configuration 320 because memory access is direct and uniform as opposed to indirect and distributed. Due to local access of memory in die by processing elements (PE) of compute die 402, latency is reduced compared to latency in package configuration 320. The close and direct connection between compute die 402 and memory die 401 allows memory of memory die 401 to behave as a fast accessible cache memory.

In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

Figure 4B:
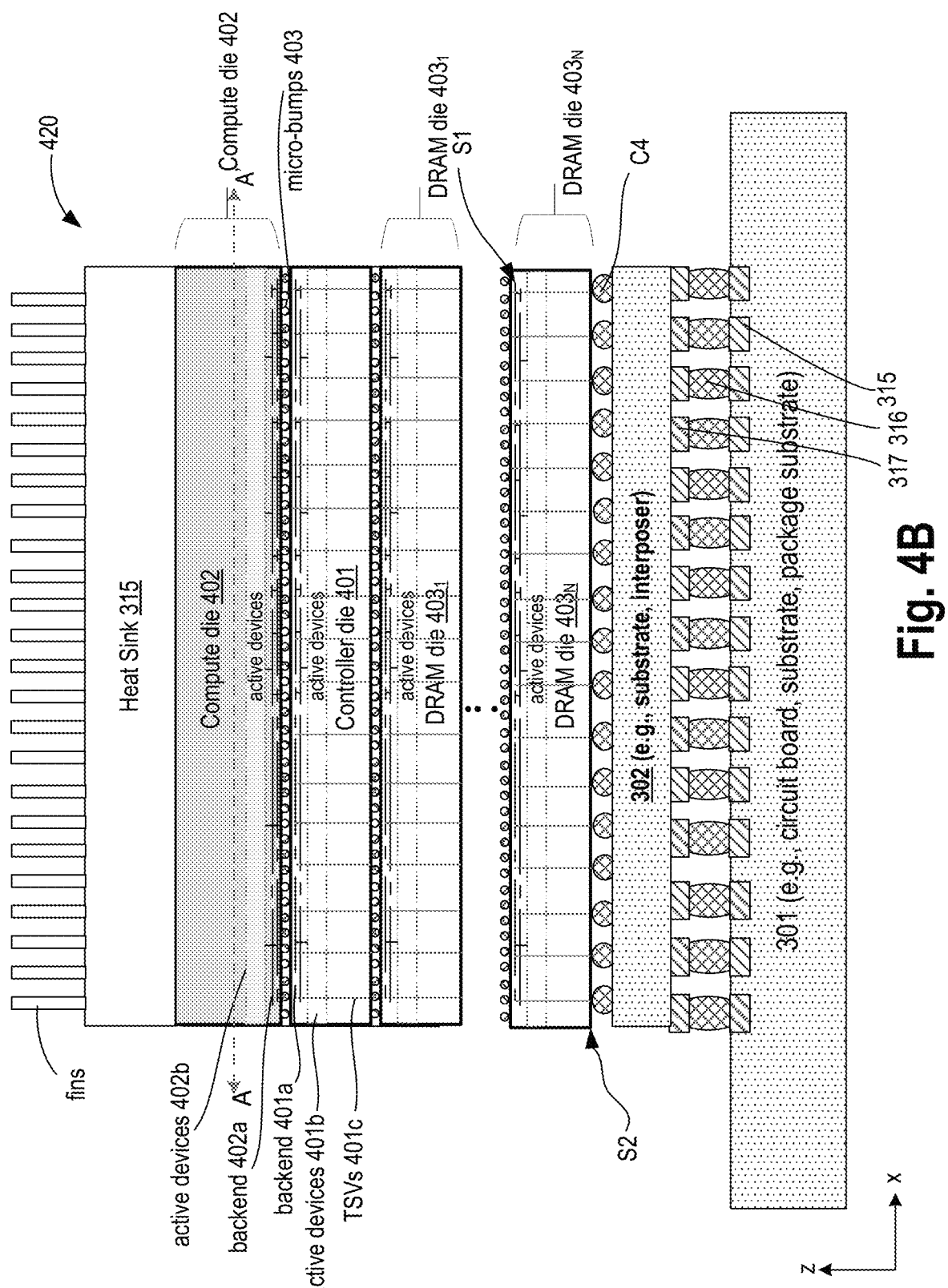
FIG. 4B illustrates a cross-section of a package comprising a computational block, which includes a compute die (e.g., an inference logic die) above a stack of memory dies and a controller logic die, in accordance with some embodiments.

FIG. 4B illustrates a cross-section of a package 420 (herein also referred to as package configuration 420) comprising a computational block, which includes a compute die (e.g., an inference logic die) above a stack of memory dies and a controller logic die, in accordance with some embodiments. Compared to package configuration 400, here a stack of memory dies is positioned below compute die 402. The stack of memory dies include die 401 which may include memory (such as cache) and controller circuitries (e.g., row/column controllers and decoders, read and write drivers, sense amplifiers etc.). Below die 401, memory dies $403_{1-N}$ are stacked, where die $403_1$ is adjacent to die 401 and die $403_N$ is adjacent to substrate 302, and where 'N' is an integer greater than 1. In some embodiments, each die in the stack is wafer-to-wafer bonded via micro-bumps or Cu-to-Cu hybrid pillars. In various embodiments, the active devices of each memory die $403_{1-N}$ are away from C4 bumps and more towards active devices of 402a.

However, in some embodiments, memory dies $403_{1-N}$ can be flipped so that the active devices face substrate 302. In some embodiments, connection between compute die 402 and first memory die 401 (or controller die with memory) is face-to-face, and can result in higher bandwidth for that interface compared to interfaces with other memory dies in the stack. The TSVs through the memory dies can carry signal and power from compute die 402 to C4 bumps. The TSVs between various memory dies can carry signals between the dies in the stack, or power (and ground) to the C4 bumps. In some embodiments, communication channel between compute die 402 or memory dies across the stack is connected through TSVs and micro-bumps or wafer-to-wafer Cu-hybrid bonds. While the embodiment of FIG. 4B illustrates the memory to be DRAM, the memory can be embedded with DRAM, SRAM, flash, Fe-RAM, MRAM, Fe-SRAM, Re-RAM, etc., or a combination of them.

In some embodiments, variable pitch TSVs (e.g., TSVs 401c) between memory dies (e.g., 401 and/or $403_{1-N}$) enables high count of I/Os between the dies, resulting in distributed bandwidth. In some embodiments, stacked memory dies connected through combinations of TSVs, and bonding between dies (e.g., using micro-hump or wafer-to-wafer bonding), can carry power and signals. In some embodiments, variable pitch TSVs enable high density on bottom die (e.g., die 401), with I/Os implemented with tighter pitch, while power and/or ground lines are implemented with relaxed pitch TSVs.

Figure 4C:
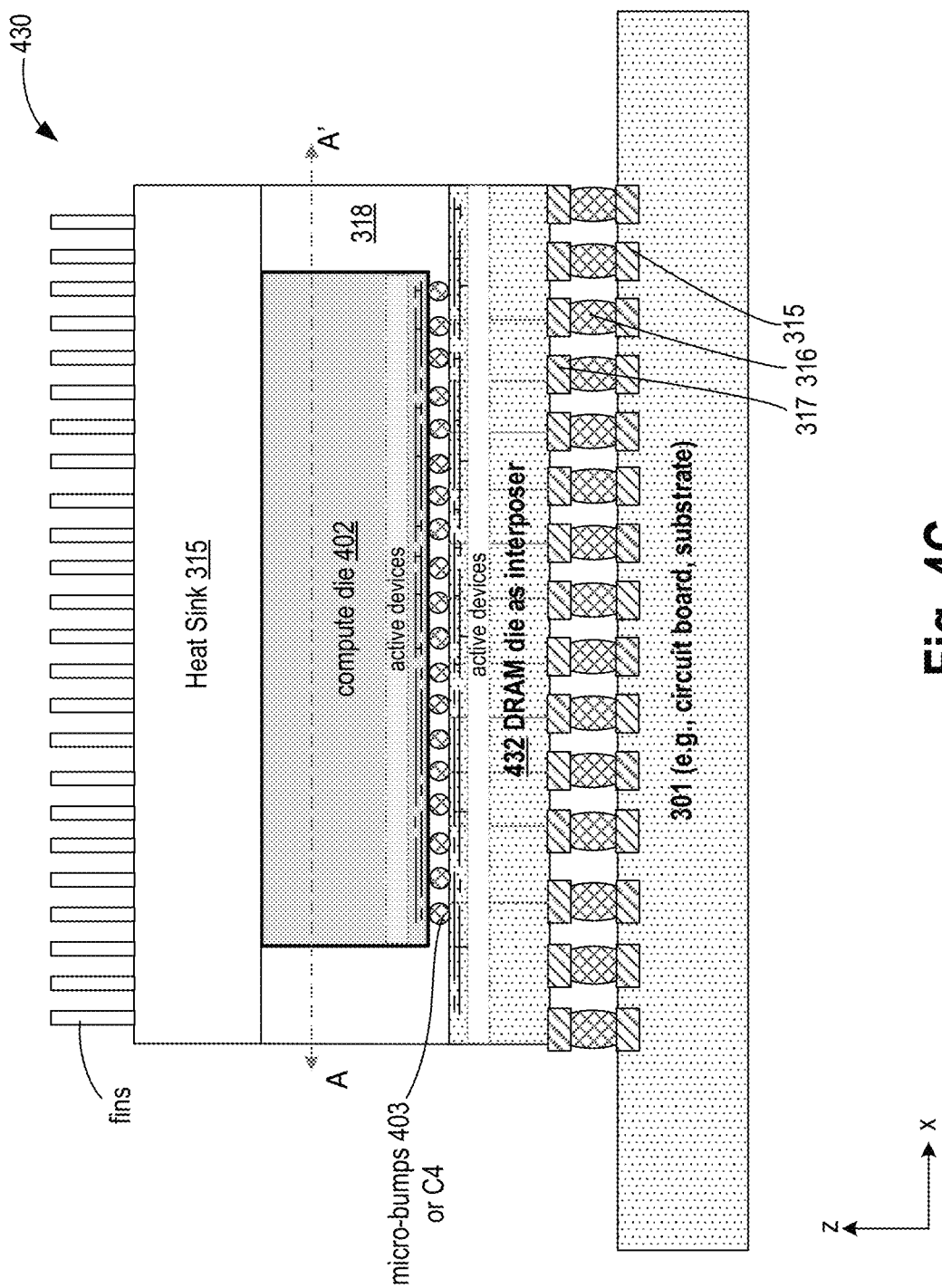
FIG. 4C illustrates a cross-section of a package comprising a computational block, which includes a compute die over a memory (e.g., DRAM) that also functions as an interposer, in accordance with some embodiments.

FIG. 4C illustrates a cross-section of a package 430 (also referred to as package configuration 430) comprising a computational block, which includes a compute die over a memory (e.g., DRAM) that also functions as an interposer, in accordance with some embodiments. In some embodiments, compute die 402 is embedded in encapsulant 318. In some embodiments, encapsulant 318 can be any suitable material, such as epoxy-based build-up substrate, other dielectric/organic materials, resins, epoxies, polymer adhesives, silicones, acrylics, polyimides, cyanate esters, thermoplastics, and/or thermosets.

Compared to package configuration 400, here memory die 401 is removed and integrated in interposer 432 such that the memory provides storage function as well as a function of an interposer. This configuration allows for reducing package cost. Interconnections 403 (e.g., C4 bumps or micro bumps) now electrically couple compute die 402 to memory 432. Memory 432 may comprise DRAM, embedded DRAM, flash, FE-SRAM, FE-DRAM, SRAM, MRAM, Re-RAM, or a combination of them. The same advantages of FIG. 4A are also realized in this embodiment. In some embodiments, memory die 401 is embedded in substrate or interposer 302.

In some embodiments, a compute die and two or more memories are positioned along a plane of the package, and a memory is provided that also functions as an interposer. In some embodiments, memory interposer 432 is replaced with a three dimensional (3D) RAM stack that also functions as an interposer. In some embodiments, the 3D memory stack is a stack of DRAM, embedded DRAM, MRAMs, Re-RAMs, or SRAMs.

Figure 5A:
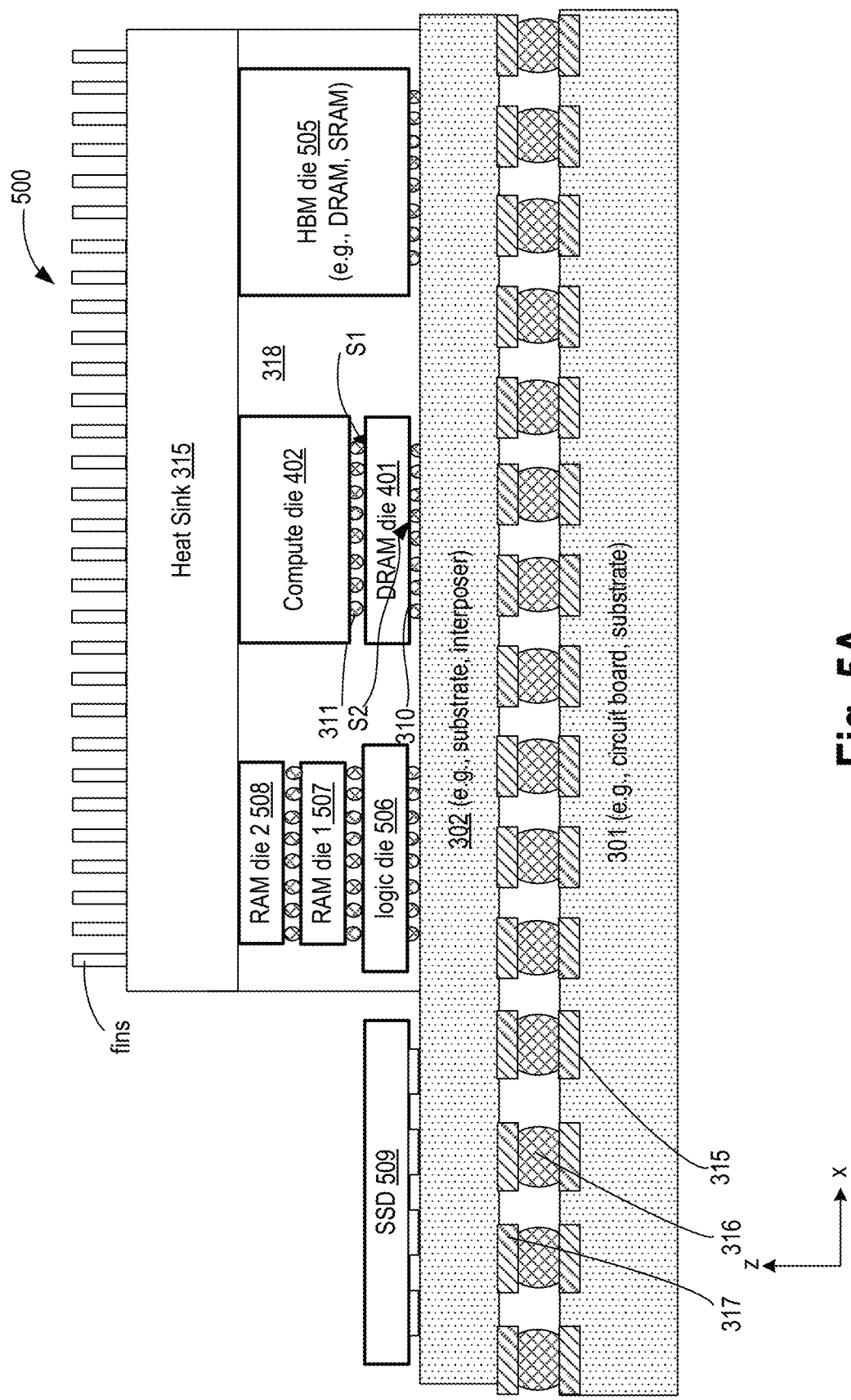
FIG. 5A illustrates a cross-section of package comprising an AI machine, which includes a system-on-chip (SOC) having a computational block, which includes a compute die over a DRAM, in accordance with some embodiments.

FIG. 5A illustrates a cross-section of package 500 comprising an AI machine, which includes a system-on-chip (SOC) having a computational block, which includes a compute die over a memory, in accordance with some embodiments. Package 500 comprises processor die 506 coupled to substrate or interposer 302. Two or more memory dies 507 (e.g., memory 104) and 508 (e.g., memory 106) are stacked on processor die 506. Processor die 506 (e.g., 105) can be any one of: central processing unit (CPU), graphics processor unit (GPU), DSP, field programmable grid array (FPGA) processor, or application specific integrated circuit (ASIC) processor. Memory (RAM) dies 507 and 508 may comprise DRAM, embedded DRAM, FE-SRAM, FE-DRAM, SRAM, MRAM. Re-RAM, or a combination of them. In some embodiments, RAM dies 507 and 508 may include HBM. In some embodiments, one of memories 104 and 106 is implemented as HBM in die 405. The memories in HBM die 505 include any one or more of: DRAM, embedded DRAM, FE-SRAM, FE-DRAM, SRAM, MRAM, Re-RAM, or a combination of them. Heat sink 315 provides a thermal management solution to the various dies in encapsulant 318. In some embodiments, solid-state drive (SSD) 509 is positioned outside of first package assembly that includes heat sink 315. In some embodiments, SSD 509 includes one of NAND flash memory, NOR flash memory, or any other type of non-volatile memory such as DRAM, embedded DRAM, MRAM, FE-DRAM, FE-SRAM, Re-RAM etc.

Figure 5B:
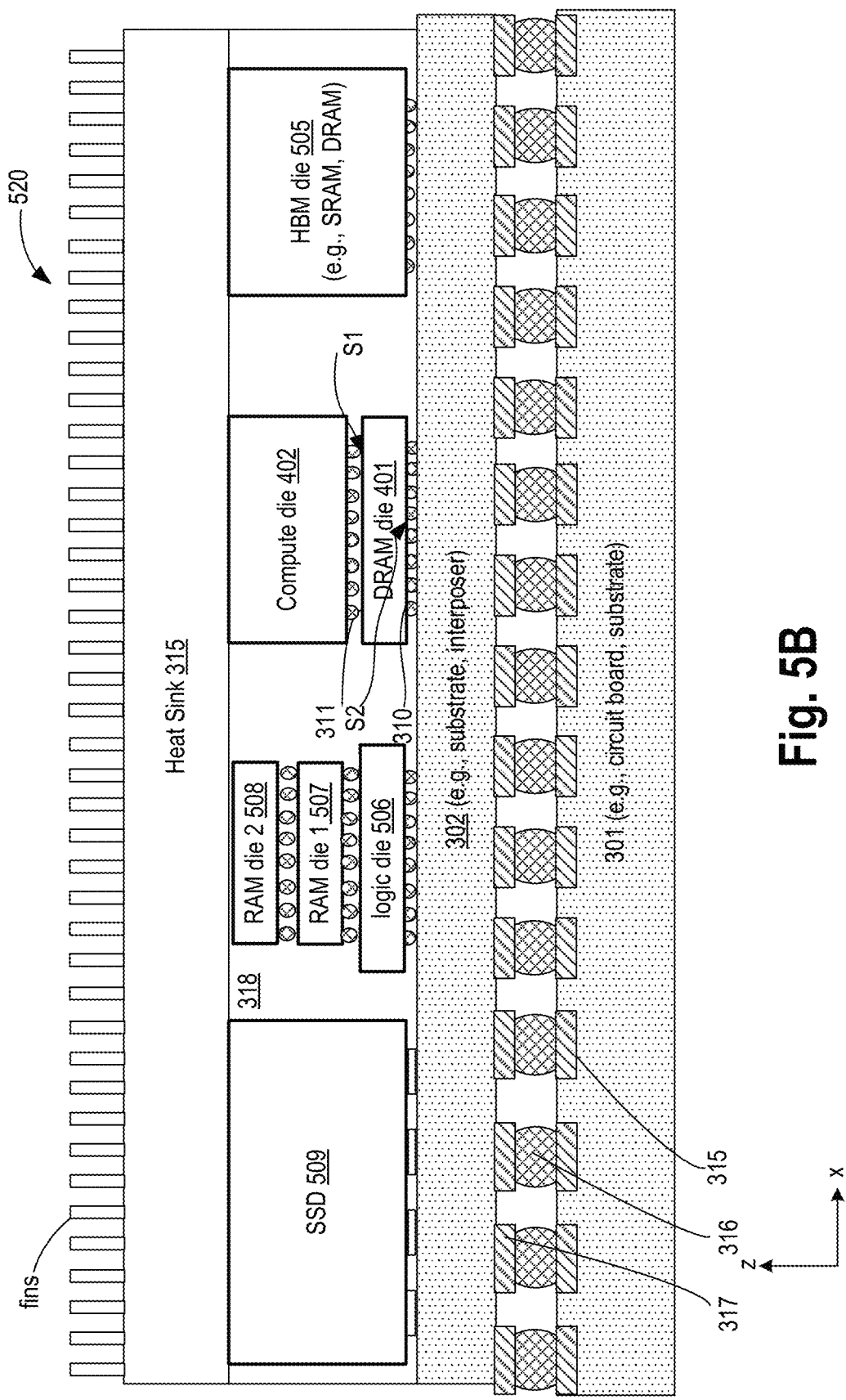
FIG. 5B illustrates a cross-section of a package comprising an AI machine, which includes an SOC having a computational block, which includes a compute die over a DRAM, a processor, and a solid-state memory, in accordance with some embodiments.

FIG. 5B illustrates a cross-section of package 520 comprising an AI machine, which includes an SOC having a computational block, which includes a compute die over a memory, a processor, and a solid-state memory, in accordance with some embodiments. Package 520 is similar to package 500 but for incorporating SSD 509 within a single package under a common heat sink 315. In this case, a single packaged SOC provides an AI machine which includes the capability of generating a training model and then using the trained model for different data to generate output.

Figure 5C:
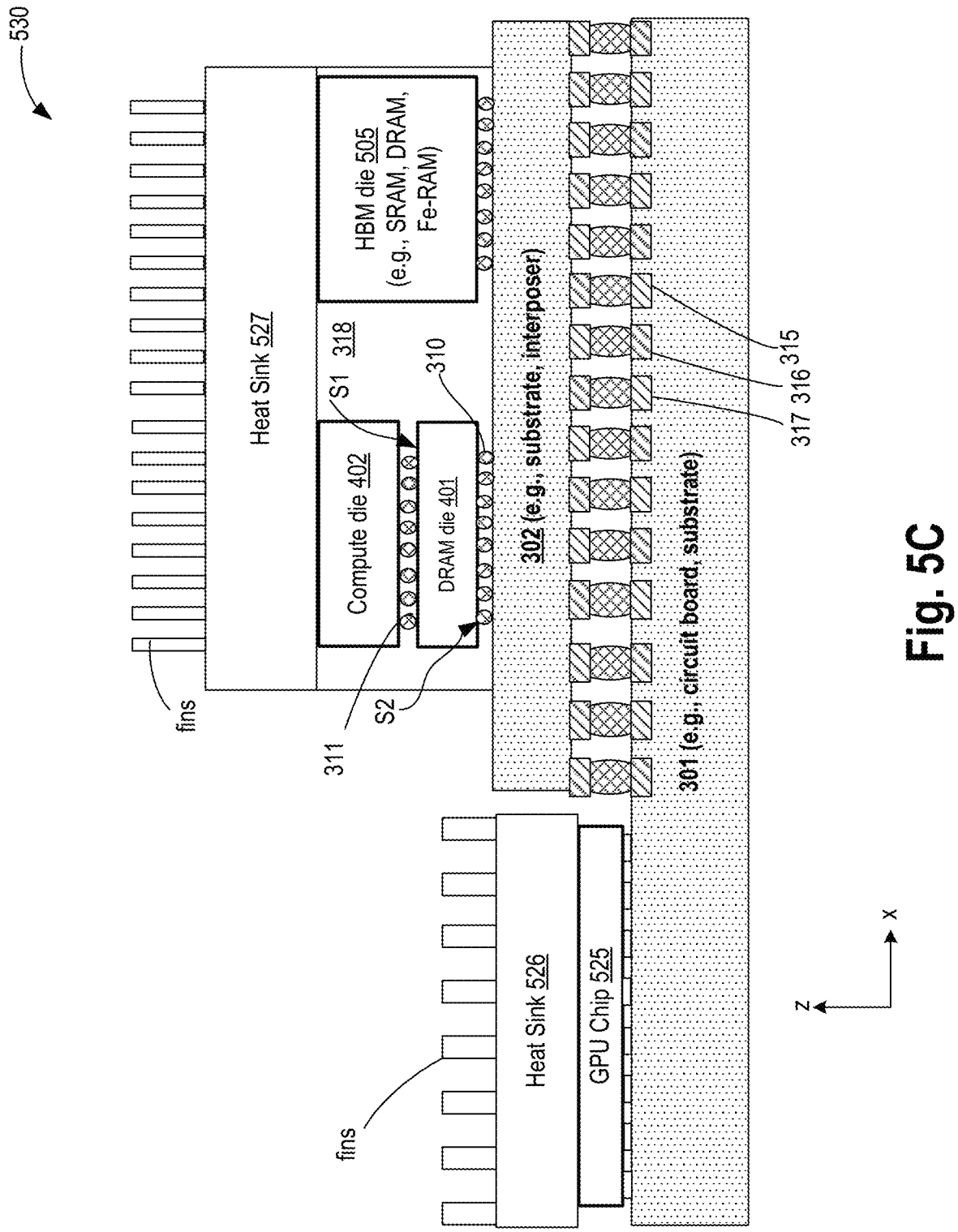
FIG. 5C illustrates a cross-section of multiple packages on a circuit board, where one of the packages includes a compute die over a memory die, and another of the packages includes a graphics processor unit, in accordance with some embodiments.

FIG. 5C illustrates a cross-section 530 of multiple packages on a circuit board, where one of the packages includes a compute die over a memory die, and another of the packages includes a graphics processor unit, in accordance with some embodiments. In this example, an AI processor such as CPU 525 (GPU, DSP, FPGA, ASIC, etc.) is coupled to substrate 301 (e.g., printed circuit board (PCB)). Here, two packages are shownL—one with heat sink 526 and the other with heat sink 527. Heat sink 526 is a dedicated thermal solution for GPU chip 525 while heat sink 527 provides a thermal solution for the computational block (dies 402 and 304) with HBM 505).

FIG. 6A illustrates unit cell (or processing element (PE)) 600 of compute die 402 which is configured to couple with memory die 401 below it, in accordance with some embodiments. In some embodiments, PE 600 comprises matrix multiplication unit (MMU) 601, registers 602, system bus controller 603, east/west (E/W) bus 604, north/south (N/S) bus 605, local memory controller 606, and die-to-die I/interface 607. MMU 601 plays the same role as multiplier 103 while registers 602 are used to save inputs 102a and weights 102b. System bus controller 603 controls the data and control communication by E/W bus 604 and N/W bus 605. Local memory controller 606 controls selection of inputs and weights and associated read and write drivers. Die-to-die I/O interface communicates with the memory unit cell underneath.

FIG. 6B illustrates unit cell 620 of memory die 401 which is configured to couple with compute die 402 above it, in accordance with some embodiments. Memory unit cell 600 comprises an array of bit-cells, where each array can be a unit array cell. In this example, a 4×4 unit array is shown, where each unit array (e.g., Array 0,0; Array 0,4; Array 4,0; Array 4,4) includes a plurality of bit-cells arranged in rows and columns. However, any N×M array can be used for the unit array, where 'N' and 'M' are integers that can be same or different numbers. The bit-cells of each array are accessible by a row address decoder. The bit-cells of each array can be read from and written to using the adjacent read/write control and drivers. Unit cell 600 includes control and refresh logic 626 to control reading and writing to the bit-cells of the array. Unit cell 600 includes die-to-die I/O interface 627 which is used to communicate with die-to-die I/O interface 607 of PE 600.

Figure 7A:
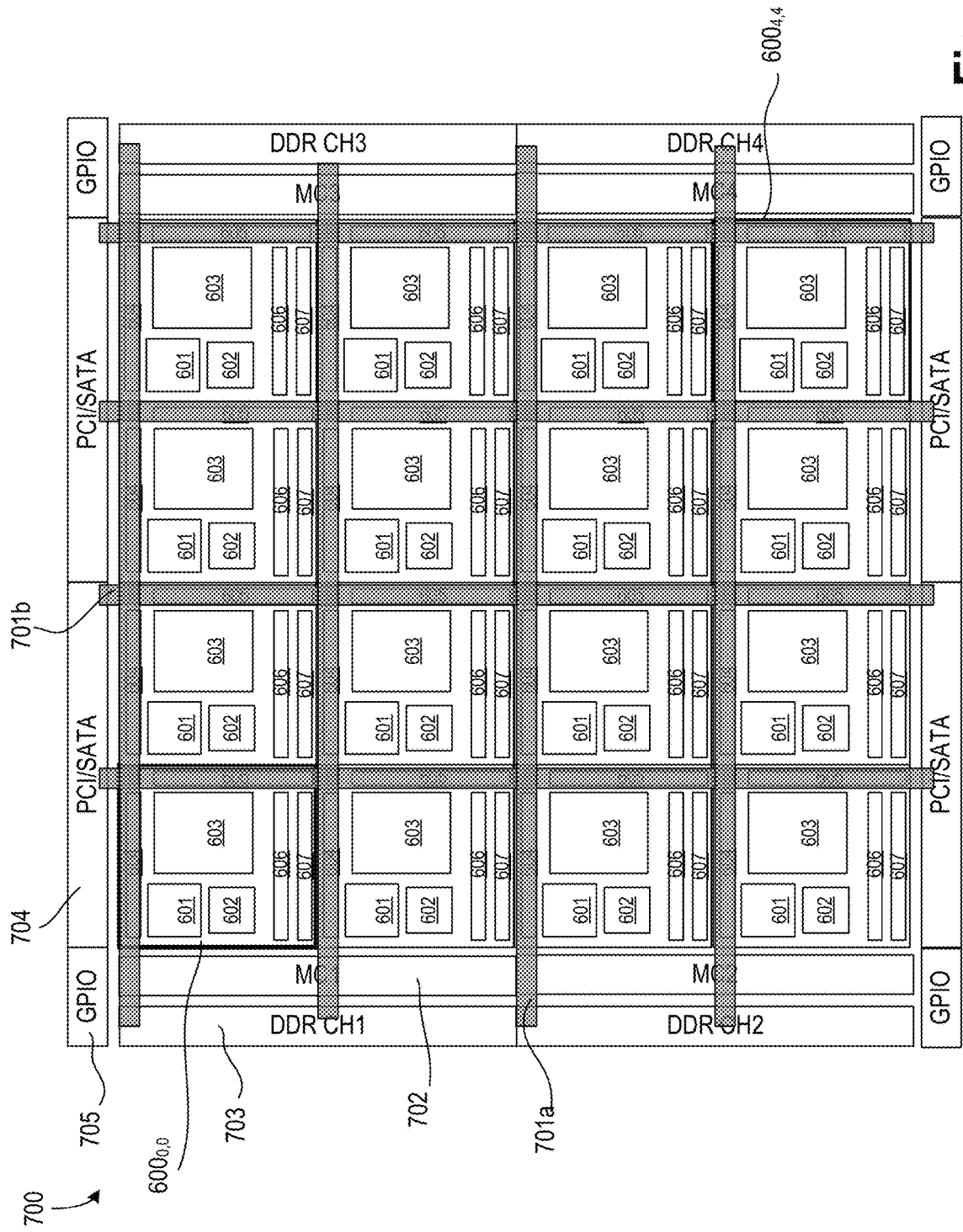
FIG. 7A illustrates a compute die comprising a plurality of unit cells of FIG. 6A, in accordance with some embodiments.

FIG. 7A illustrates compute die 700 (e.g., 402) comprising a plurality of units cells 600$_{N,M}$ (where 'N' and 'M' are 4 in this example) of FIG. 6A, in accordance with some embodiments. Note, 'N' and 'M' can be any number depending on the desired architecture. Compute die 700 includes I/O interfaces and memory channels along its periphery. PEs 600$_{N,M}$ are accessible by network-on-chip (NoC) comprising routers, drivers, and interconnects 701a and 701b. In some embodiments, two sides (or more) have memory channels (MC) 702 including MC1 through MC4. In some embodiments, compute die 700 includes double data rate (DDR) compliant channels 703 (e.g., DDR CH1, DDR CH2, DDR CH3, DDR CH4). However, the embodiments are not limited to DDR compliant I/O interfaces. Other low power and fast interfaces can also be used. In some embodiments, compute die 700 includes PCIe (peripheral component interconnect express) and/or SATA (Serial AT attachment) interfaces 704. Other serial or parallel I/O interfaces can also be used. In some embodiments, additional general purpose I/O (GPIO) interfaces 705 are added along the periphery of compute die 700. Each PE is above a corresponding memory unit cell. The architecture of compute die 700 allows break up the memory of memory die 401 into as many channels as desired, and assists with increased bandwidth, lower latency, and lower access energy.

Figure 7B:
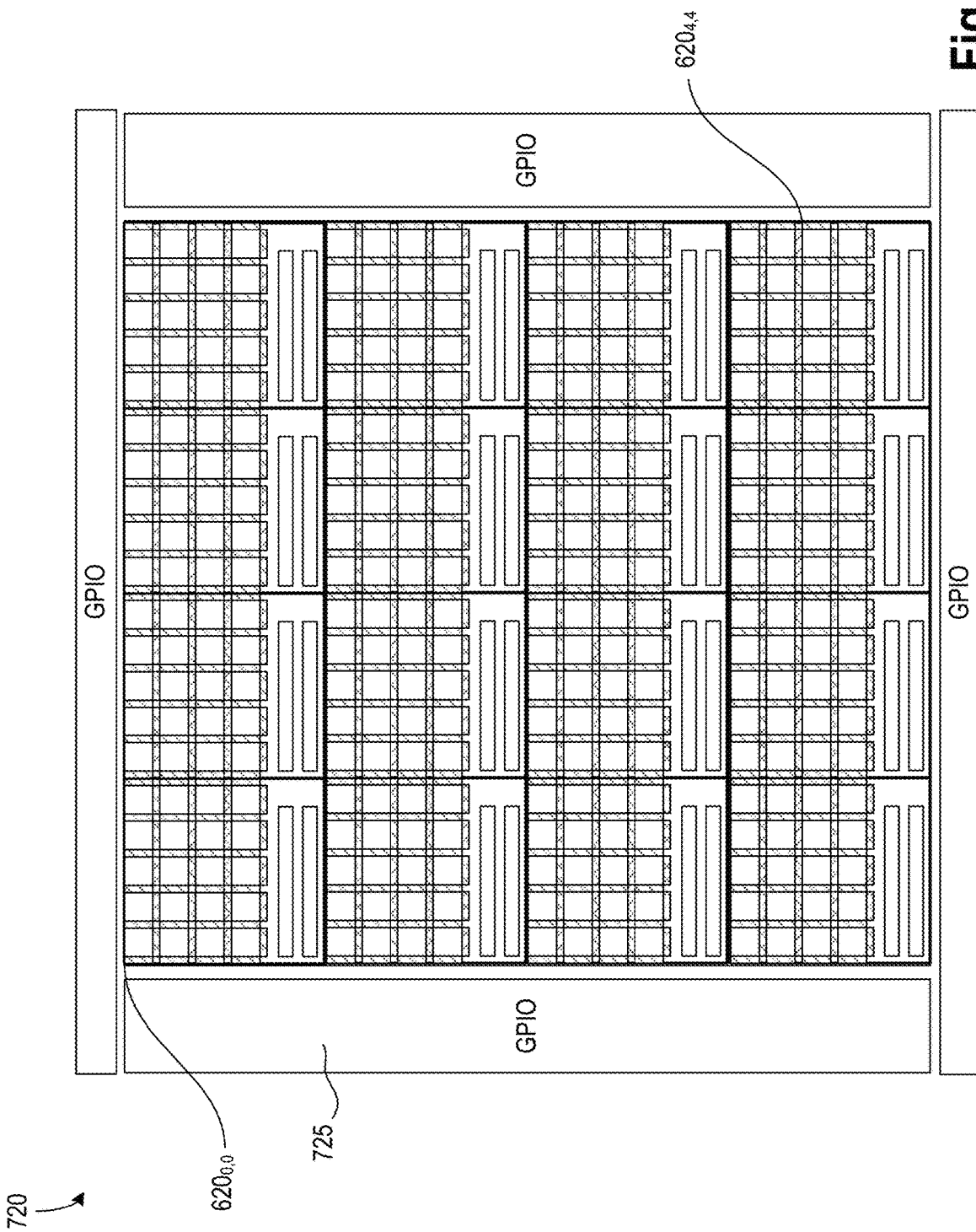
FIG. 7B illustrates a memory die comprising a plurality of unit cells of FIG. 6B, in accordance with some embodiments.

FIG. 7B illustrates memory die 720 comprising a plurality of unit cells 620$_{N,M}$ (where 'N' and 'M' are 4 in this example) of FIG. 6B, in accordance with some embodiments. In some embodiments, memory die 720 communicates with compute die 700 above via GPIOs 725. In other embodiments, other types of I/Os may be used to communicate with compute die 700.

Figure 8:
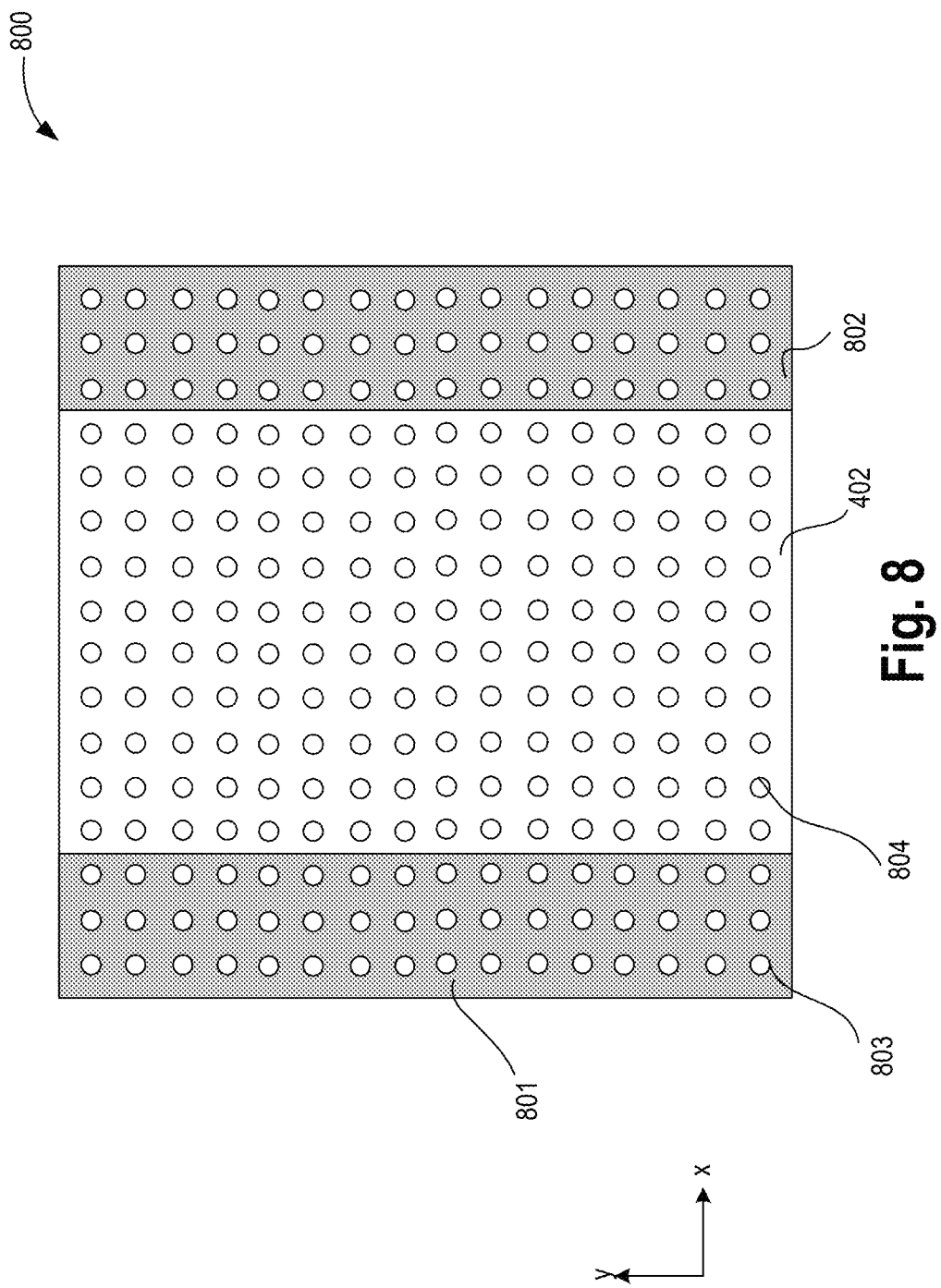
FIG. 8 illustrates a cross-section of a top view of the compute die with micro-humps on the sides to connect with memories along a horizontal plane, in accordance with some embodiments.

FIG. 8 illustrates a cross-section of a top view 800 of compute die 402 with micro-bumps on the sides to connect with memories along a horizontal plane, in accordance with some embodiments. The shaded regions 801 and 802 on either side of compute die 402 include micro-bumps 803 that are used to connect to memories on either side of compute die 402. Micro-bumps 804 may be used to connect to substrate 302 or interposer 302.

Figure 9:
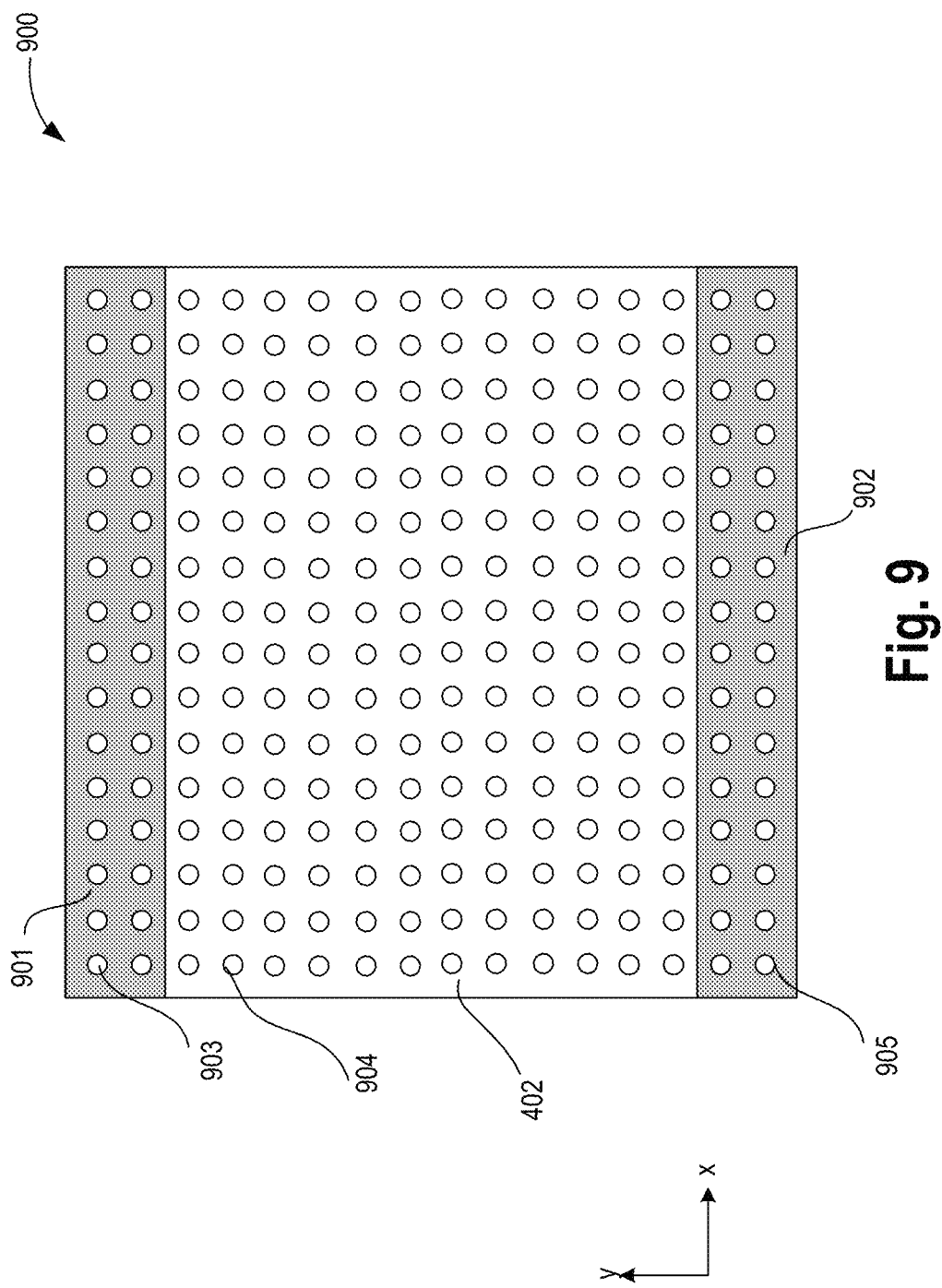
FIG. 9 illustrates a cross-section of a top view of the compute die with micro bumps on the top and bottom of the compute die to connect with memory dies along a vertical plane of the package, in accordance with some embodiments.

FIG. 9 illustrates a cross-section of a top view 900 of compute die 402 with micro bumps on the top and bottom of the compute die to connect with memory dies along a vertical plane of the package, in accordance with some embodiments. The shaded regions 901 and 902 on upper and lower side sections of compute die 402 include micro-bumps 903 and 905 that are used to connect to upper and lower memories, respectively. Micro-bumps 904 may be used to connect to substrate 302 or interposer 302.

Figure 10:
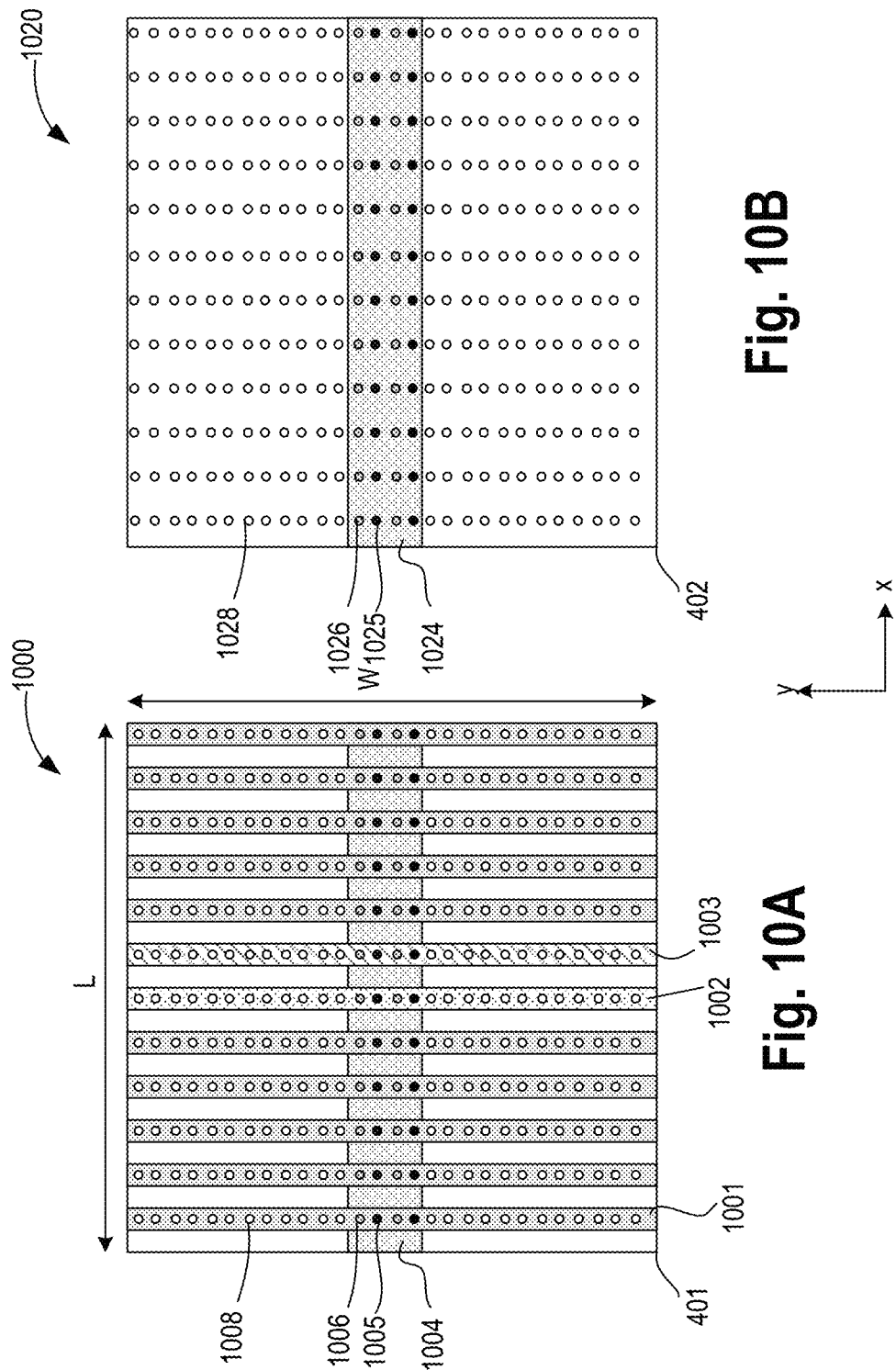
FIG. 10A illustrates a cross-section of a memory die, which is below the compute die, in accordance with some embodiments.
FIG. 10B illustrates a cross-section of a compute die, which is above the memory die, in accordance with some embodiments.

FIG. 10A illustrates cross-section 1000 of a memory die (e.g., 401), which is below compute die 402, in accordance with some embodiments. Memory die 401 has a pitch of L'×'W'. Cross-section 1000 shows strips of TSVs that are used to connect to compute die 402. Strips of shade 1001 carry signals while strips 1002 and 1003 carry power and ground lines. Strip 1004 provides power and ground signals 1005 and 1006 to the memory cells within a row. TSVs 1008 connect signals (e.g., word-line) to memory bit cells.

FIG. 10B illustrates cross-section 1020 of a compute die (e.g., 402), which is above the memory die (e.g., 401), in accordance with some embodiments. TSVs 1028 may couple to TSVs 1008 while strip 1024 is over strip 1004. TSVs 1025 and 1026 couple to TSVs 1005 and 1006, respectively.

Figure 11:
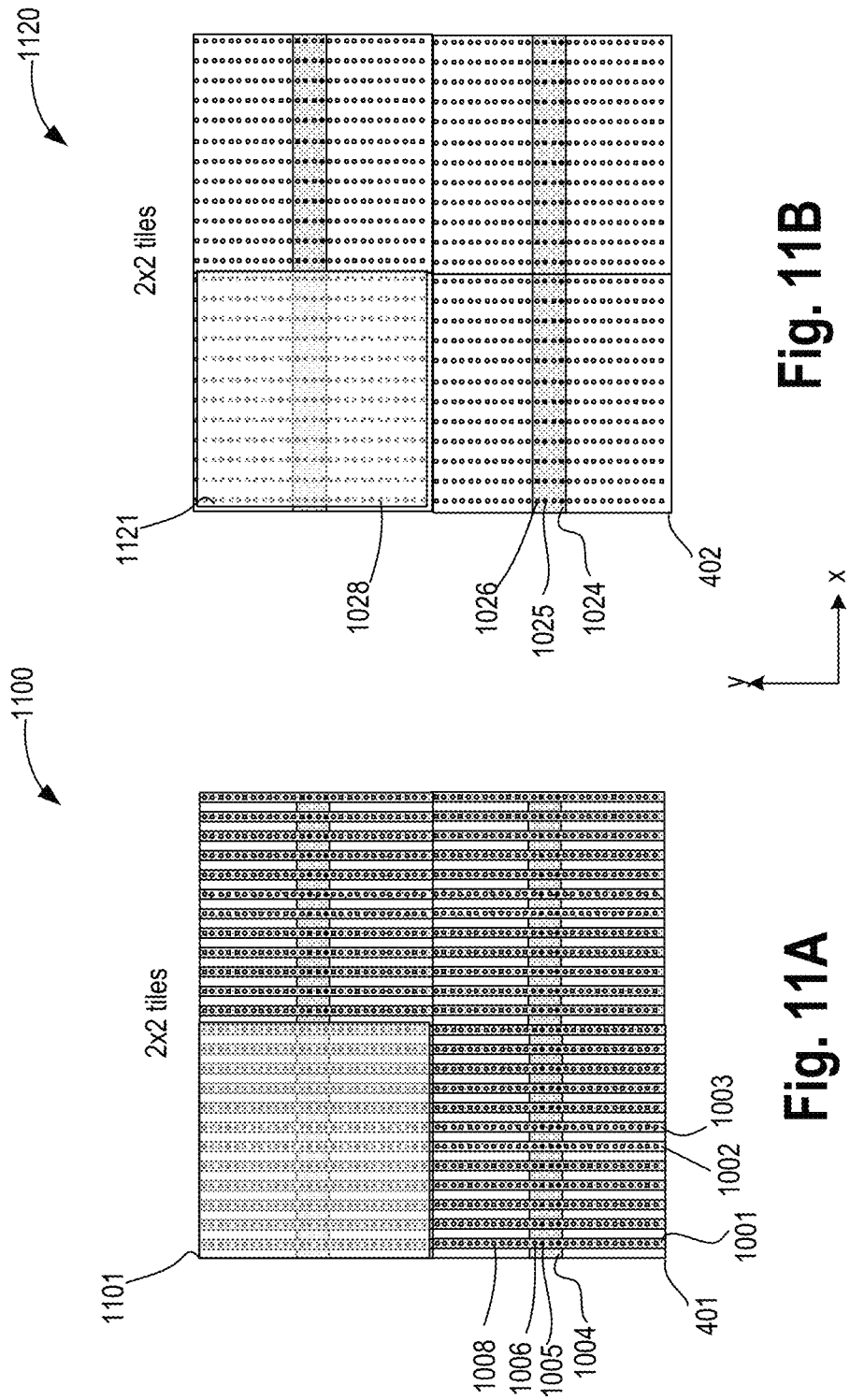
FIG. 11A illustrates a cross-section of a memory die with 2×2 tiles, which is below the compute die, in accordance with some embodiments.
FIG. 11B illustrates a cross-section of a compute die with 2×2 tiles, which is above the memory die, in accordance with some embodiments.

FIG. 11A illustrates cross-section 1100 of a memory die 401 with 2×2 tiles, which is below the compute die, in accordance with some embodiments. While memory die 401 of FIG. 10A illustrates a single tile, here 2×2 tiles are used to organize the memory. This allows to cleanly partition the memory for storing data and weights. Here, a tile is indicated by tile 1101. The embodiments are not limited to 2×2 tiles and organization of M×N tiles (where M and N are integers that may be equal or different).

FIG. 11B illustrates cross-section 1120 of a compute die with 2×2 tiles, which is above the memory die, in accordance with some embodiments. Like memory die 401, compute die 402 can also be partitioned into tiles. Each tile 1121 is like a compute die 402 of FIG. 10B, in accordance with some embodiments. Such an organization of compute die 402 allows to run different training models with different input data and weight simultaneously or in parallel.

Figure 12:
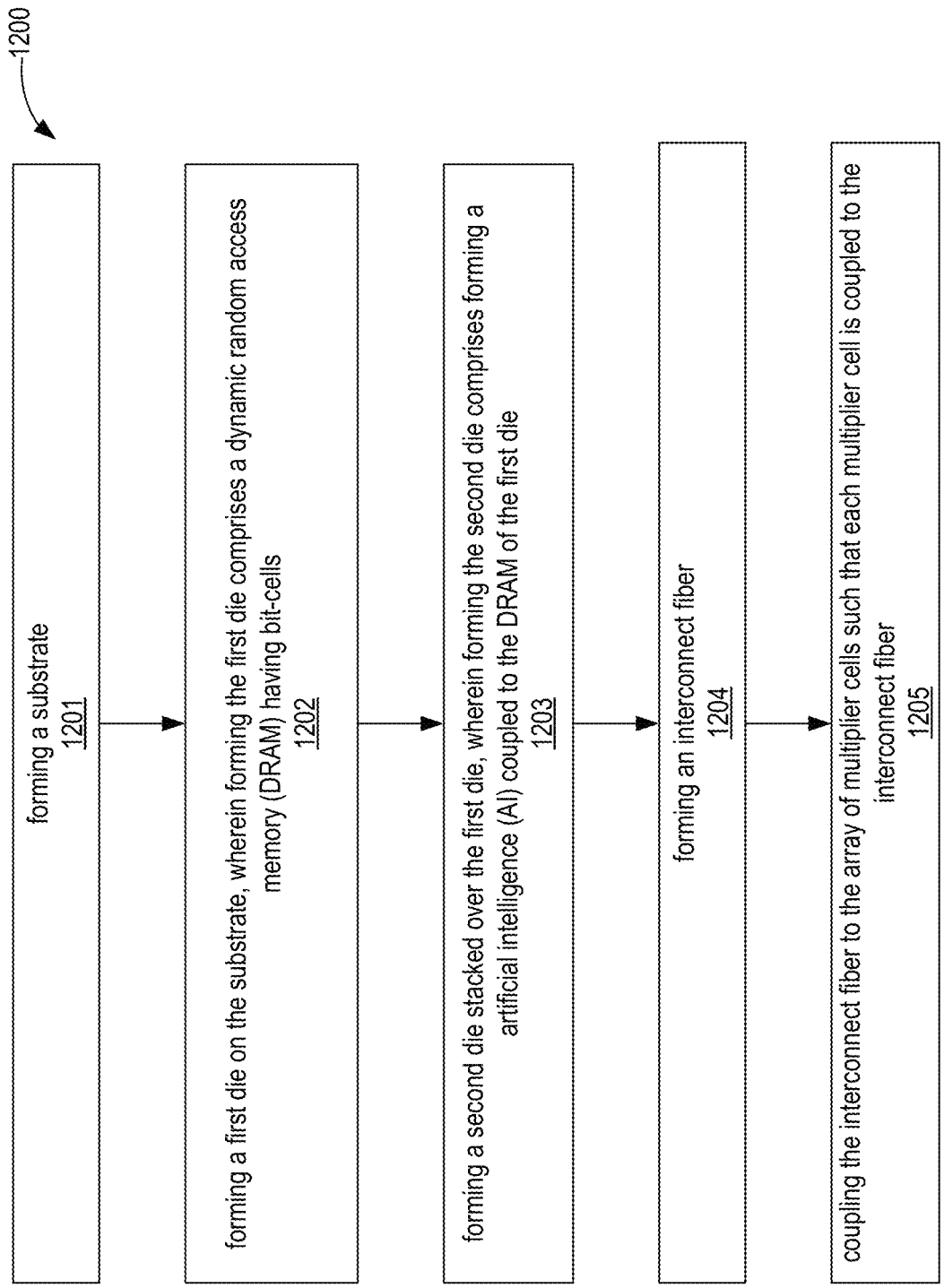
FIG. 12 illustrates a method of forming a package with compute die over the memory die, in accordance with some embodiments.

FIG. 12 illustrates flowchart 1200 of a method of forming a package of a computational block, which includes a compute die (e.g., an inference logic die) above a memory die, in accordance with some embodiments. The blocks in the flowchart 1200 are illustrated in a particular order. However, the order of the various processing steps can be modified without changing the essence of the embodiments. For example, some processing blocks may be processed simultaneously, while others may be performed out of order.

At block 1201, a substrate (e.g., 302) is formed. In some embodiments, substrate 302 is package substrate. In some embodiments, substrate 302 is an interposer (e.g. active or passive interposer). At block 1202, a first die (e.g., 401) is formed on the substrate. In some embodiments, forming the first die comprises a dynamic random-access memory (DRAM) having bit-cells, wherein each bit-cell comprises an access transistor and a capacitor. At block 1203, a second die (e.g., compute die 402) is formed and stacked over the first die, wherein forming the second die comprises forming a computational logic coupled to the memory of the first die. In some embodiments, forming the computational logic includes forming an array of multiplier cells, and wherein the DRAM includes an array of memory bit-cells.

At block 1204, an interconnect fabric is formed. At block 1205, the interconnect fabric is coupled to the array of multiplier cells such that each multiplier cell is coupled to the interconnect fabric. In some embodiments, the DRAM is partitioned into a first partition operable as buffers, and a second partition to store weight factors.

In some embodiments, the method of flowchart 1200 comprises: receiving data by the computational logic from the first partition and the second partition; and providing an output of the computational logic to a logic circuitry. In some embodiments, forming the computational logic comprises forming ferroelectric logic. In some embodiments, the computational logic is operable to multiply at least two matrices. In some embodiments, the method of forming the substrate comprises forming active or passive devices. In some embodiments, the method comprises: forming a third die (e.g., a logic die or a memory) on the substrate. In some embodiments, the method comprises coupling the third die on the substrate. In some embodiments, the method comprises a fourth die comprising dynamic random-access memory (DRAM), and stacking the fourth die over the third die. In some embodiments, the method comprises coupling a heat sink to the second die.

In some embodiments, the method comprises coupling the AI processor to the DRAM of the first die, which comprises wafer-to-wafer bonding the first and second dies; or coupling the AI processor to the DRAM of the first die, which comprises coupling the first and second dies via micro-bumps. In some embodiments, the method comprises: forming the first die includes forming through-silicon-vias (TSVs) in the first die, wherein a number of TSVs are substantially fewer than a number of micro-bumps. In some embodiments, the method comprises: coupling the first and second dies via micro-bumps, which comprises coupling the first and second dies such that active devices of the first die and active devices of the second die are closer to the micro-bumps than to a heat sink. In some embodiments, the method comprises: supplying the TSVs with power and ground supplies. In some embodiments, the method comprises: coupling a device external to the apparatus via the TSVs, wherein the second die is independent of TSVs. In some embodiments, the method comprises forming the first die on the substrate, which comprises coupling the first die to the substrate via C4 bumps. In some embodiments, the method comprises forming network-on-chip (NoC) on the first or second die. In some embodiments, the method comprises coupling a heat sink to the second die.

In some embodiments, forming the AI includes forming an array of multiplier cells, and wherein the DRAM includes an array of memory bit-cells, and wherein the AI processor is operable to multiply at least two matrices. In some embodiments, the method comprises: forming an interconnect fabric; and coupling the interconnect fabric to the array of multiplier cells such that each multiplier cell is coupled to the interconnect fabric. In some embodiments, the DRAM is partitioned into a first partition operable as buffers, and a second partition to store weight factors, wherein the method comprises: receiving data by the computational logic from the first partition and the second partition; and providing an output of the AI processor to a logic circuitry.

Figure 13:
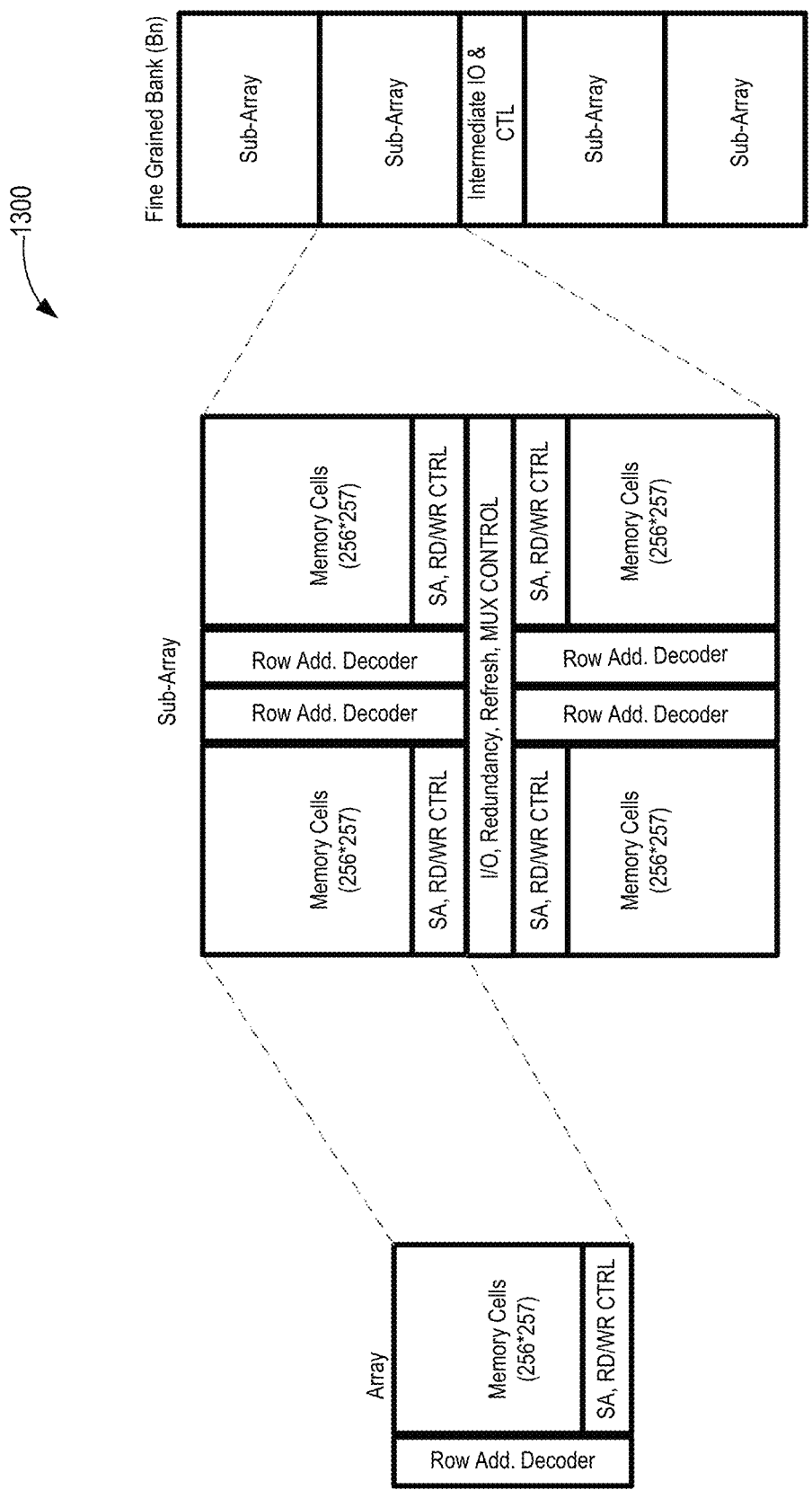
FIG. 13 illustrates memory architecture of part of the memory die, in accordance with some embodiments.

FIG. 13 illustrates memory architecture 1300 of part of memory die 401, in accordance with some embodiments. In some embodiments, memory organization uses fine-grained banks. These fine-grained banks use smaller arrays and sub-arrays. In this example, smaller array size (e.g., 128× 129 or 256×257) is used for improved speed for some applications. In some embodiments, wide bus access is used to reduce undesired activation energy cost. In some embodiments, a memory bank can be built with larger number of sub-arrays. Similarly sub-arrays with larger number of arrays can also be used.

Figure 14:
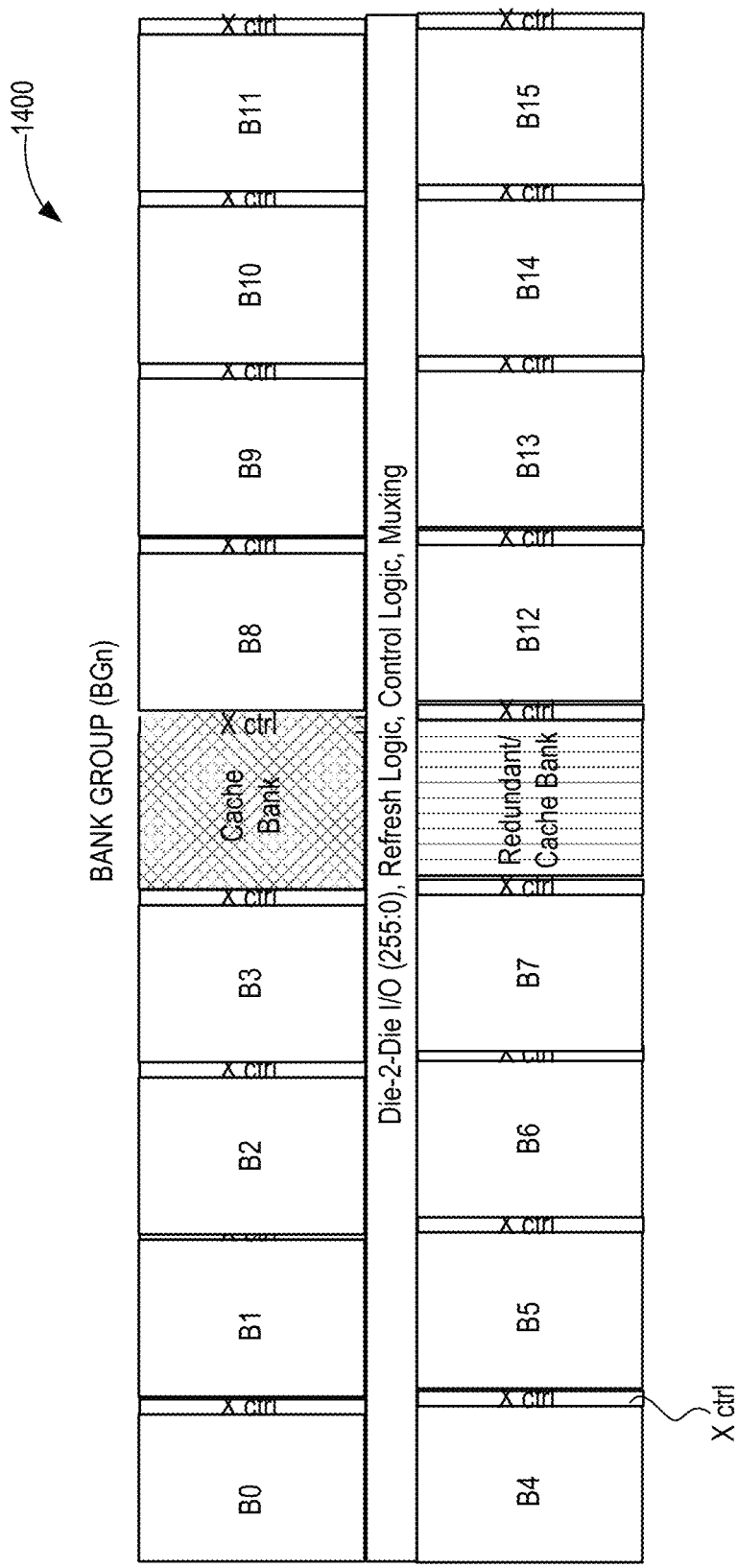
FIG. 14 illustrates a bank group in the memory die, in accordance with some embodiments.

FIG. 14 illustrates bank group 1400 in memory die 401, in accordance with some embodiments. In some embodiments, one bank group (BGn) may comprise multiple fine-grained banks. For example, one bank may comprise a cache bank to allow 1T-SRAM type of interface from timing perspective for DRAM or embedded DRAM (eDRAM) refresh timing management. Refresh timing management in conjunction with DRAM is used to provide high bandwidth, low latency interface that can hide periodic refresh requirements in the background, while not obstructing normal read/write accesses to the memory blocks. In some embodiments, memory die 401 may comprise of redundant banks for remapping. In some embodiments, different number of active banks can be implemented within a bank group by using or organizing larger or smaller count of fine-grained banks. In some embodiments, memory bank refresh (e.g., for eDRAM or DRAM) can happen individually. In some embodiments, logic is provided for smart refresh using cache bank.

Figure 15:
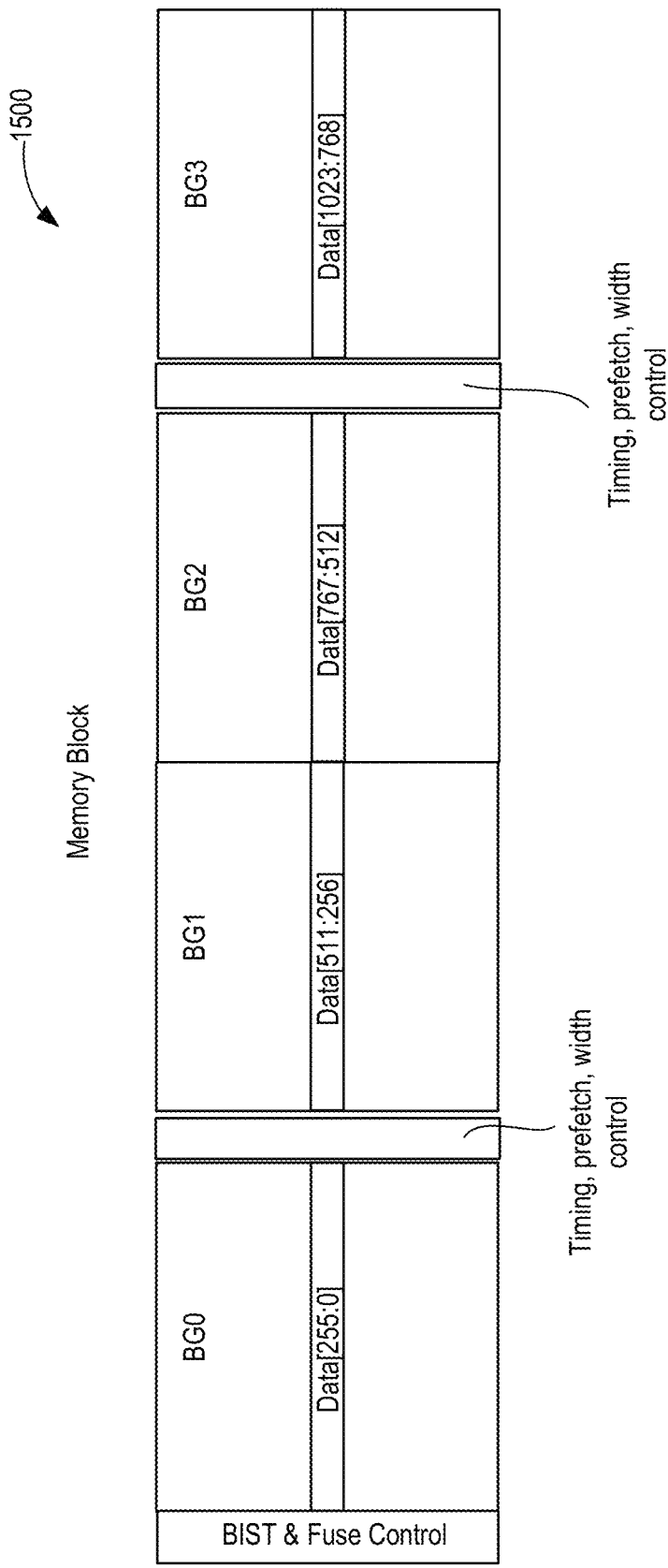
FIG. 15 illustrates a memory channel or block in the memory die, in accordance with some embodiments.

FIG. 15 illustrates memory channel 1500 or block in the memory die, in accordance with some embodiments. A memory channel can comprise one or more bank groups. In some embodiments, intermediate blocks are used to facilitate data width sizing and/or to sequence prefetch for each memory access to allow matching of I/O speed with any inherent speed limitations within the memory bank.

FIG. 16 illustrates memory die 1600 partitioned in a plurality of channels, in accordance with some embodiments. In various embodiments, the bottom memory die 401 comprises multiple memory sub-blocks per die. Each sub-block provides independent wide channel access to the top compute die 402. In some embodiments, the bottom die itself may also include network-on-chip (NoC) to facilitate communicate between different memory sub-blocks.

Figure 17:
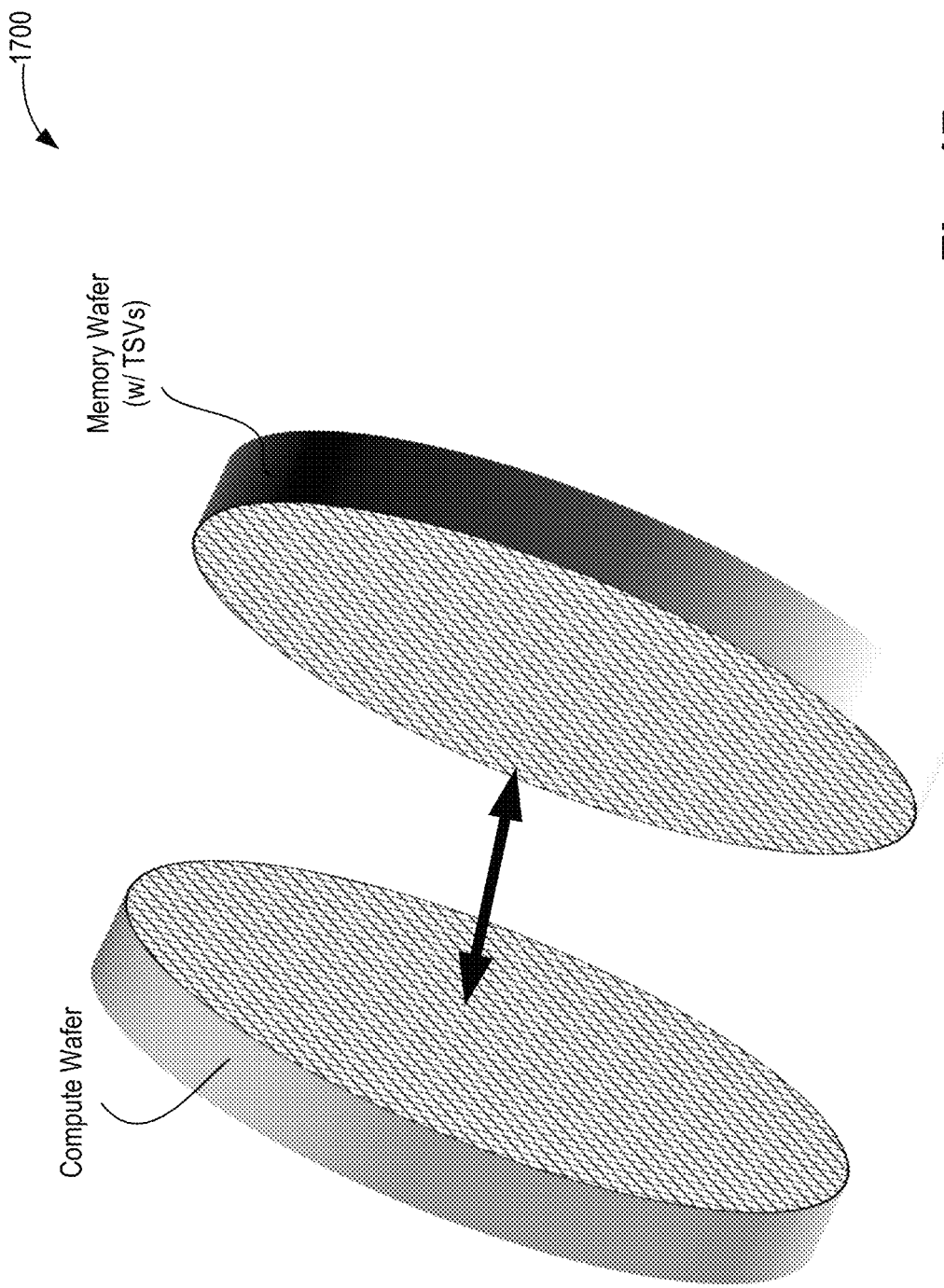
FIG. 17 illustrates an apparatus showing wafer-to-wafer bonding with micro-bumps or Cu—Cu hybrid bonding, in accordance with some embodiments.

FIG. 17 illustrates apparatus 1700 showing wafer-to-wafer bonding with micro-bumps or Cu—Cu hybrid bonding, in accordance with some embodiments. As discussed herein, memory wafer has TSVs to interface with C4 bumps (or package side). In some embodiments, memory wafers are thinned after bonding to reduce the length of TSVs from memory die 401 to compute die 402. As such, tighter TSV pitch is achieved that reduces IR drop and reduces latency (resulting in higher operating speeds).

Figure 18:
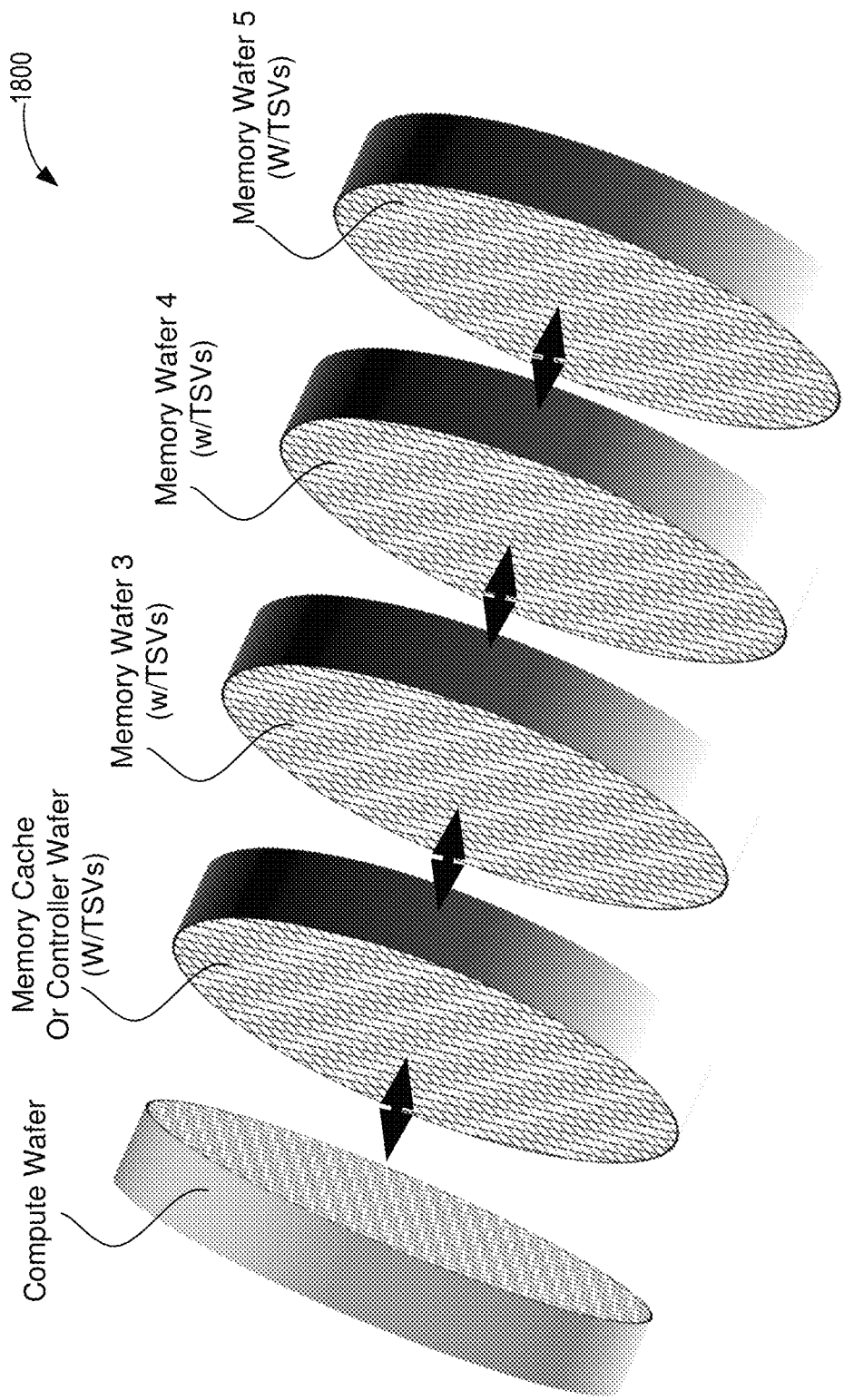
FIG. 18 illustrates an apparatus showing wafer-to-wafer bonding with a stack of memory cells, where first memory wafer of the stack is directly connected with the compute wafer, in accordance with some embodiments.

FIG. 18 illustrates apparatus 1800 showing wafer-to-wafer bonding with a stack of memory cells, where first memory wafer of the stack is directly connected with the compute wafer, in accordance with some embodiments. In this example, the first memory wafer (having memory or controller die 401) is directly connected to the compute wafer (having compute die 402). Such face-to-face bonding allows for higher number of I/O channels. In some embodiments, memory wafers are thinned after bonding to reduce the length of TSVs from memory die 401 to compute die 402. As such, tighter TSV pitch is achieved that reduces IR drop and reduces latency (resulting in higher operating speeds).

Figure 19:
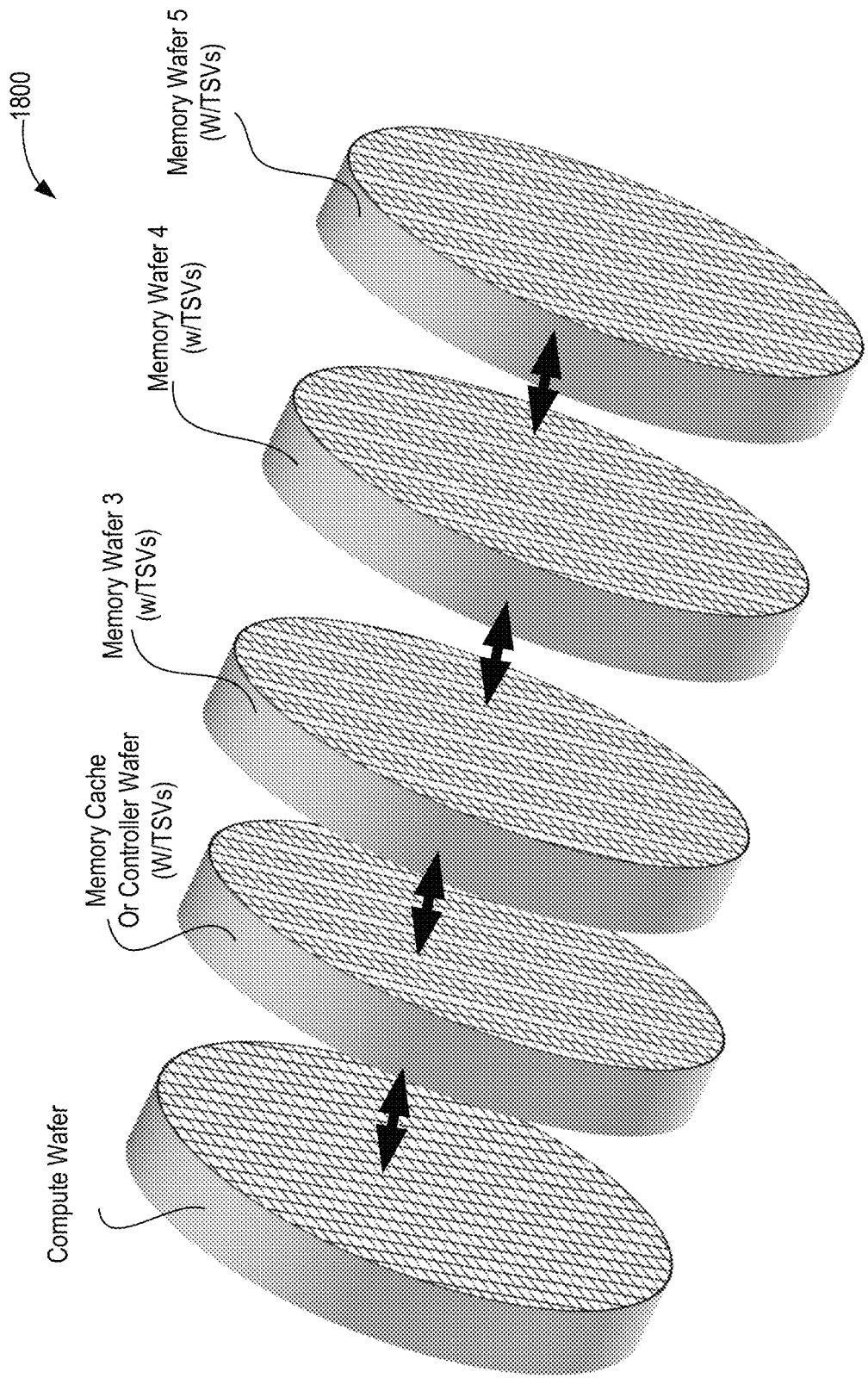
FIG. 19 illustrates an apparatus showing wafer-to-wafer bonding with a stack of memory cells, where first memory wafer of the stack is indirectly connected with the compute wafer, in accordance with some embodiments.

FIG. 19 illustrates apparatus 1900 wafer-to-wafer bonding with a stack of memory cells, where first memory wafer of the stack is indirectly connected with the compute wafer, in accordance with some embodiments. In this example, the stack of wafers (that are died into dies) are not connected face-to-face. For example, the active devices of the dies do not face one another in this example.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other examples without changing the scope of the invention.

Example 1: An apparatus comprising: a substrate; a first die on the substrate, wherein the first die comprises a dynamic random-access memory (DRAM) having bit-cells, wherein each bit-cell comprises an access transistor and a capacitor; and a second die stacked over the first die, wherein the second die comprises a computational block coupled to the DRAM of the first die.

Example 2: The apparatus of example 1, wherein the first and second dies are wafer-to-wafer bonded or die-to-wafer bonded.

Example 3: The apparatus of example 1, wherein the first and second dies are coupled via at least one of: micro-bumps, copper-to-copper hybrid bond, or wire bond.

Example 4: The apparatus of example 3, wherein the first die includes through-silicon-vias (TSVs), wherein a number of TSVs is substantially less than a number of the micro-bumps.

Example 5: The apparatus of example 4, wherein the TSVs include power and ground lines, and lines to couple a device external to the apparatus.

Example 6: The apparatus of example 4, wherein the second die is independent of TSVs.

Example 7: The apparatus of example 3, wherein the first and second dies are coupled such that active devices of the first die and active devices of the second die are closer to the micro-bumps than to a heat sink.

Example 8: The apparatus of example 1, wherein the first die is coupled to the substrate via C4 bumps.

Example 9: The apparatus of example 1, wherein the first or second dies include a network-on-chip (NoC).

Example 10: The apparatus of example 1, wherein the compute die includes an array of multiplier cells, and wherein the DRAM includes an array of memory bit-cells.

Example 11: The apparatus of example 10 comprising an interconnect fabric coupled to the array of multiplier cells such that each multiplier cell is coupled to the interconnect fabric.

Example 12: The apparatus of example 1, wherein the DRAM is partitioned into a first partition operable as buffers; and a second partition to store weight factors.

Example 13: The apparatus of example 12, wherein the compute die is to receive data from the first partition and the second partition, and wherein an output of the computational logic is received by logic circuitry.

Example 14: The apparatus of example 12, wherein the AI processor is operable to multiply at least two matrices.

Example 15: The apparatus of example 1, wherein the substrate comprises active or passive devices.

Example 16: The apparatus of example 1, wherein a third die is on the substrate, and wherein a fourth die comprising a DRAM which is stacked over the third die.

Example 17: The apparatus of example 1, wherein a heat sink is coupled to the second die.

Example 18: The apparatus of example 1, wherein the DRAM comprises an embedded DRAM (eDRAM).

Example 19: The apparatus of example 1, wherein the compute die includes one of: FPGA, ASIC, CPU, AI processor, DSP, or GPU.

Example 20: A method comprising: forming a substrate; forming a first die on the substrate, wherein forming the first die comprises forming a dynamic random-access memory (DRAM) having bit-cells; and forming a second die, wherein forming the second die comprises forming an artificial intelligence (AI) processor; and stacking the second die over the first die, wherein stacking the second die over the first die comprises coupling the AI processor to the DRAM of the first die.

Example 21: The method of example 20, wherein: coupling the AI processor to the DRAM of the first die comprises wafer-to-wafer bonding the first and second dies; or coupling the AI processor to the DRAM of the first die comprises coupling the first and second dies via micro-bumps; forming the first die includes forming through-silicon-vias (TSVs) in the first die, wherein a number of TSVs is substantially less than a number of micro-bumps; and coupling the first and second dies via micro-bumps comprises coupling the first and second dies such that active devices of the first die and active devices of the second die are closer to the micro-bumps than to a heat sink.

Example 22: The method of example 20 comprises: supplying the TSVs with power and ground supplies; coupling a device external to the apparatus via the TSVs, wherein the second die is independent of TSVs; forming the first die on the substrate comprises coupling the first die to the substrate via C4 bumps; forming network-on-chip (NoC) on the first or second die; and coupling a heat sink to the second die.

Example 23: The method of example 20, wherein forming the AI includes forming an array of multiplier cells, and wherein the DRAM includes an array of memory bit-cells, and wherein the AI processor is operable to multiply at least two matrices.

Example 24: The method of example 20 comprising: forming an interconnect fabric; and coupling the interconnect fabric to the array of multiplier cells such that each multiplier cell is coupled to the interconnect fabric.

Example 25: The method of example 20, wherein the DRAM is partitioned into a first partition operable as buffers; and a second partition to store weight factors, wherein the method comprises: receiving data by the computational logic from the first partition and the second partition; and providing an output of the AI processor to a logic circuitry.

Example 26: A system comprising: a first memory comprising non-volatile memory (NVM) cells; a second memory, wherein the first memory is coupled to the second memory; a third memory coupled to the first memory; a first processor coupled to the second memory; and a second processor coupled to the third memory and the first processor, wherein the second processor comprises: a substrate; a first die on the substrate, wherein the first die comprises a memory having bit-cells; and a second die stacked over the first die, wherein the second die comprises computational block coupled to the memory of the first die.

Example 27: The system of example 26, wherein: the first and second dies are wafer-to-wafer bonded or die-to-wafer bonded; the first and second dies are coupled via micro-bumps; the first die includes through-silicon-vias (TSVs), wherein a number of TSVs is substantially less than a number of micro-bumps; the TSVs include power and ground lines, and lines to couple a device external to the apparatus; the second die is independent of TSVs; and the first and second dies are coupled such that active devices of the first die and active devices of the second die are closer to the micro-bumps than to a heat sink.

Example 28: The system of example 26, wherein the memory of the second processor includes one of: DRAM, flash, eDRAM, MRAM, ReRAM, SRAM, or FeRAM.

Example 29: An apparatus comprising: a substrate; a first die on the substrate, wherein the first die comprises memory having bit-cells; and a second die stacked over the first die, wherein the second die comprises a computational block coupled to the memory of the first die.

Example 30: The apparatus of example 29, wherein the second die includes one of: FPGA, ASIC, CPU, AI processor, DSP, or GPU.

Example 31: The apparatus of example 29, wherein the memory includes one of: DRAM, flash, eDRAM, MRAM, ReRAM, SRAM, or FeRAM.

Example 32: An apparatus comprising: a substrate; a stack of memory dies including a first die which comprises memory having bit-cells, and a second die comprising controller logic, cache, or memory, wherein one of the dies of the stack is on the substrate; and a compute die stacked over the second die of the stack of memory dies.

Example 33: The apparatus of claim 32, wherein the memory includes one of: DRAM, flash, eDRAM, MRAM, ReRAM, SRAM, or FeRAM.

Example 34: The apparatus of example 32, wherein the first die and the compute die are wafer-to-wafer bonded or die-to-wafer bonded.

Example 35: The apparatus of example 32, wherein the first and second dies are coupled via at least one of: micro-bumps, copper-to-copper hybrid bond, or wire bond.

Example 36: The apparatus of example 32, wherein the first die and the compute die are coupled via at least one of: micro-bumps, copper-to-copper hybrid bond, or wire bond.

Example 37: The apparatus of example 36, wherein the die of the stack which is on the substrate includes through-silicon-vias (TSVs), wherein a number of TSVs is substantially less than a number of the micro-bumps, copper-to-copper hybrid bond, or wire bond.

Example 38: The apparatus of example 32, wherein the compute die is independent of TSVs.

Example 39: The apparatus of example 32, wherein at least one of the dies in the stack or the compute die includes a network-on-chip (NoC).

Example 40: The apparatus of example 32, wherein the compute die includes one of: FPGA, ASIC, CPU, AI processor, DSP, or GPU.

Example 41: An apparatus comprising: a substrate; a stack of memory dies including a first die which comprises memory having bit-cells, and a second die comprising controller logic, cache or memory, wherein one of the dies of the stack is on the substrate; and an artificial intelligence processor die stacked over the second die of the stack of memory dies.

Example 42: The apparatus of example 41, wherein the memory includes one of: DRAM, flash, eDRAM, MRAM, ReRAM, SRAM, or FeRAM.

Example 43: The apparatus of example 41, wherein the first die and the compute die are wafer-to-wafer bonded or die-to-wafer bonded.

Example 44: The apparatus of example 41, wherein the first and second dies are coupled via at least one of: micro-bumps, copper-to-copper hybrid bond, or wire bond.

Example 45: The apparatus of example 41, wherein the first die and the artificial intelligence processor die are coupled via at least one of: micro-bumps, copper-to-copper hybrid bond, or wire bond.

Example 46: The apparatus of example 45, wherein the die of the stack which is on the substrate includes through-silicon-vias (TSVs), wherein a number of TSVs is substantially less than a number of the micro-bumps, copper-to-copper hybrid bond, or wire bond.

Example 47: The apparatus of example 41, wherein the artificial intelligence processor die is independent of TSVs.

Example 48: A system comprising: a first memory comprising non-volatile memory (NVM) cells; a second memory, wherein the first memory is coupled to the second memory; a third memory coupled to the first memory; a first processor coupled to the second memory; and a second processor coupled to the third memory and the first processor, wherein the second processor comprises: a substrate; a stack of memory dies including a first die which comprises memory having bit-cells, and a second die comprising controller logic, cache, or memory, wherein one of the dies of the stack is on the substrate; and a compute die stacked over the second die of the stack of memory dies.

Example 49: The system of claim 48, wherein the memory of the first die includes one of: DRAM, flash, eDRAM, MRAM, ReRAM, SRAM, or FeRAM.

Example 50: The system of example 17, wherein: the first die and the compute die are wafer-to-wafer bonded or die-to-wafer bonded; the first and second dies are coupled via at least one of: micro-bumps, copper-to-copper hybrid bond, or wire bond; the first die and the compute die are coupled via at least one of: micro-bumps, copper-to-copper hybrid bond, or wire bond; and wherein the die of the stack which is on the substrate includes through-silicon-vias (TSVs), wherein a number of TSVs is substantially less than a number of the micro-bumps, copper-to-copper hybrid bond, or wire bond.

Example 51: The system of example 48, wherein the compute die is independent of TSVs.

Example 52: The system of example 48, wherein at least one of the dies in the stack or the compute die includes a network-on-chip (NoC).

Example 53: The system of example 48, wherein the compute die includes one of: FPGA, ASIC, CPU, AI processor, DSP, or GPU.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
    forming a substrate;
    placing a first die on the substrate, wherein the first die comprises a random-access memory (RAM) having bit-cells, wherein placing the first die on the substrate comprises coupling the first die directly on the substrate without an intermediate die between the substrate and the first die, wherein the first die has a first surface and a second surface opposite to the first surface, the first surface facing the substrate, and wherein the first die includes first active devices closer to the second surface than the first surface;
    forming a second die, wherein forming the second die comprises forming computational logic; and
    stacking the second die over the first die, wherein stacking the second die over the first die comprises coupling the computational logic to the RAM of the first die, wherein the second die substantially overlaps the first die, the second die having a third surface and a fourth surface opposite to the third surface, wherein the third surface faces the second surface wherein the second die includes second active devices, wherein the second active devices are closer to the third surface than the fourth surface, and wherein the RAM is partitioned into a first partition operable as buffers and a second partition to store weight factors.

2. The method of claim 1, wherein:
    coupling the computational logic to the RAM of the first die comprises wafer-to-wafer bonding the first and second dies; or
    coupling the computational logic to the RAM of the first die comprises coupling the first and second dies via micro-bumps.

3. The method of claim 2, wherein coupling the first and second dies via the micro-bumps comprises coupling the first and second dies are coupled such that active devices of the first die and active devices of the second die are closer to the micro-bumps than to a heat sink.

4. The method of claim 1, wherein forming the first die includes forming through-silicon-vias (TSVs) in the first die.

5. The method of claim 4, wherein a number of TSVs is substantially less than a number of micro-bumps.

6. The method of claim 4 comprises:
    supplying the TSVs with power and ground supplies; and
    coupling a device external to the computational logic via the TSVs, wherein the second die is independent of TSVs.

7. The method of claim 1 wherein forming the first die on the substrate comprises coupling the first die to the substrate via C4 bumps.

8. The method of claim 1 comprising forming network-on-chip (NoC) on the first die or second die.

9. The method of claim 1 comprising coupling a heat sink to the second die.

10. The method of claim 1, wherein forming the computational logic includes forming an array of multiplier cells, and wherein the RAM includes an array of memory bit-cells, and wherein the computational logic is operable to multiply at least two matrices.

11. The method of claim 10 comprising:
    forming an interconnect fabric; and
    coupling the interconnect fabric to the array of multiplier cells such that each multiplier cell is coupled to the interconnect fabric.

12. The method of claim 1, wherein the method comprises:
    receiving data by the computational logic from the first partition and the second partition; and
    providing an output of the computational logic to a logic circuitry.

13. The method of claim 1, wherein the RAM is one of: DRAM, flash, eDRAM, MRAM, ReRAM, SRAM, or FeRAM.

14. A method comprising:
forming a substrate;
placing a first die on the substrate, wherein the first die comprises memory having bit-cells, wherein placing the first die on the substrate comprises coupling the first die directly on the substrate without an intermediate die between the substrate and the first die, wherein the first die has a first surface and a second surface opposite to the first surface, the first surface facing the substrate, and wherein the first die includes first active devices closer to the second surface than the first surface; and
stacking a second die over the first die, wherein the second die comprises a computational block coupled to the memory of the first die, wherein the second die substantially overlaps the first die, the second die having a third surface and a fourth surface opposite to the third surface, wherein the third surface faces the second surface wherein the second die includes second active devices, wherein the second active devices are closer to the third surface than the fourth surface, and wherein the memory is partitioned into a first partition operable as buffers and a second partition to store weight factors.

15. The method of claim 14, wherein the second die includes one of: FPGA, ASIC, CPU, AI logic, DSP, or GPU.

16. The method of claim 14, wherein the memory includes one of: DRAM, flash, eDRAM, MRAM, ReRAM, SRAM, or FeRAM.

17. A method comprising:
forming a substrate;
placing a first die on the substrate, wherein the first die comprises a ferroelectric random-access memory (FeRAM) having bit-cells, wherein placing the first die on the substrate comprises coupling the first die directly on the substrate without an intermediate die between the substrate and the first die, wherein the first die has a first surface and a second surface opposite to the first surface, the first surface facing the substrate, and wherein the first die includes first active devices closer to the second surface than the first surface;
forming a second die, wherein forming the second die comprises forming computational logic; and
stacking the second die over the first die, wherein stacking the second die over the first die comprises coupling the computational logic to the FeRAM of the first die, wherein the second die substantially overlaps the first die, the second die having a third surface and a fourth surface opposite to the third surface, wherein the third surface faces the second surface wherein the second die includes second active devices, wherein the second active devices are closer to the third surface than the fourth surface, and wherein the FeRAM is partitioned into a first partition operable as buffers and a second partition to store weight factors.

18. The method of claim 17, wherein:
coupling the computational logic to the FeRAM of the first die comprises wafer-to-wafer bonding the first and second dies; or
coupling the computational logic to the FeRAM of the first die comprises coupling the first and second dies via micro-bumps, wherein coupling the first and second dies via micro-bumps comprises coupling the first and second dies are coupled such that active devices of the first die and active devices of the second die are closer to the micro-bumps than to a heat sink.

19. The method of claim 17, wherein forming the first die includes forming through-silicon-vias (TSVs) in the first die, wherein a number of TSVs is substantially less than a number of micro-bumps.

\* \* \* \* \*